(12) United States Patent
Donahue et al.

(10) Patent No.: US 11,374,406 B2
(45) Date of Patent: Jun. 28, 2022

(54) GRID-TIED ELECTRIC METER ADAPTER AND SYSTEMS FOR AUTOMATED POWER RESILIENCE AND ON-DEMAND GRID BALANCING

(71) Applicant: NEWORLD.ENERGY LLC, Reno, NV (US)

(72) Inventors: Paul W. Donahue, Newport Beach, CA (US); Ryan Paul Donahue, Newport Beach, CA (US); Jeffrey Alan Dankworth, Reno, NV (US)

(73) Assignee: NEWORLD.ENERGY LLC, Reno, NV (US)

( * ) Notice: Subject to any disclaimer, the term of this patent is extended or adjusted under 35 U.S.C. 154(b) by 0 days.

(21) Appl. No.: 17/588,631

(22) Filed: Jan. 31, 2022

(65) Prior Publication Data

US 2022/0158449 A1 May 19, 2022

Related U.S. Application Data

(63) Continuation of application No. 17/446,343, filed on Aug. 30, 2021, now Pat. No. 11,251,614, which is a
(Continued)

(51) Int. Cl.
*B60L 53/53* (2019.01)
*H02J 3/00* (2006.01)
(Continued)

(52) U.S. Cl.
CPC .............. *H02J 3/001* (2020.01); *B60L 53/53* (2019.02); *G01R 19/16547* (2013.01);
(Continued)

(58) Field of Classification Search
CPC ... B60L 53/53; H02J 3/00; H02J 13/00; H02J 13/00006; H02J 13/00002; H02J 3/32;
(Continued)

(56) References Cited

U.S. PATENT DOCUMENTS 10,916,940 B2   2/2021   Donahue et al.
10,951,036 B2   3/2021   Donahue et al.
(Continued)

FOREIGN PATENT DOCUMENTS

CN   103124070 B   3/2015
CN   109494776 A   3/2019
(Continued)

OTHER PUBLICATIONS

Advanced Metering Infrastructure and Customer Systems, Results from the Smart Grid Investment Grant Program, Sep. 2016, U.S. Department of Energy.
(Continued)

*Primary Examiner* — Robert L Deberadinis
(74) *Attorney, Agent, or Firm* — Knobbe, Martens, Olson & Bear, LLP

(57) ABSTRACT

A micro grid system comprises a secondary energy source and a power controller. The secondary energy source is associated with a micro grid that includes a fixed or mobile facility, and the secondary energy source is configured to generate first DC power signal. The power controller is in communication with the secondary energy source and an electric grid, and configured to receive first AC power signal from the electric grid and the first DC power signal from the secondary energy source and output a second AC power signal to loads in communication with the power controller. The power controller comprises an AC to DC frequency converter configured to change frequency and/or voltage of the second AC power signal, a processor, and a memory configured to store instructions that, when executed, cause the processor to control the frequency converter to change the frequency and/or voltage of the second AC power signal.

20 Claims, 14 Drawing Sheets

Related U.S. Application Data continuation of application No. 17/306,119, filed on May 3, 2021, now Pat. No. 11,108,232, which is a continuation of application No. 17/117,922, filed on Dec. 10, 2020, now Pat. No. 10,998,724, which is a continuation of application No. 16/843,063, filed on Apr. 8, 2020, now Pat. No. 10,916,940.

(60) Provisional application No. 62/968,523, filed on Jan. 31, 2020, provisional application No. 62/941,173, filed on Nov. 27, 2019, provisional application No. 62/870,543, filed on Jul. 3, 2019.

(51) Int. Cl.
| | |
|---|---|
| *H02J 13/00* | (2006.01) |
| *G01R 19/165* | (2006.01) |
| *H02J 3/38* | (2006.01) |
| *H02J 9/06* | (2006.01) |
| *G05B 19/042* | (2006.01) |
| *H02J 3/32* | (2006.01) |
| *H02J 4/00* | (2006.01) |
| *H02M 5/40* | (2006.01) |

(52) U.S. Cl.
CPC .............. *G05B 19/042* (2013.01); *H02J 3/32* (2013.01); *H02J 3/381* (2013.01); *H02J 4/00* (2013.01); *H02J 9/06* (2013.01); *H02J 13/00002* (2020.01); *H02J 13/00006* (2020.01); *H02M 5/40* (2013.01); *G05B 2219/2639* (2013.01); *H02J 13/00036* (2020.01); *H02J 2300/24* (2020.01); *H02J 2300/28* (2020.01)

(58) Field of Classification Search
CPC ...... H02J 3/381; H02J 3/38; H02J 4/00; H02J 9/06; H02J 2300/28; H02J 13/00036; H02J 2300/24; G01R 19/16547; G01R 19/165; G05B 19/042; G05B 2219/2639; H02M 5/40
See application file for complete search history.

(56) References Cited

U.S. PATENT DOCUMENTS

| | | |
|---|---|---|
| 10,998,724 B1 | 5/2021 | Donahue et al. |
| 11,108,232 B1 | 8/2021 | Donahue et al. |
| 11,114,853 B2 | 9/2021 | Donahue et al. |
| 2012/0283890 A1 | 11/2012 | Fu |
| 2016/0232623 A1 | 8/2016 | Parks |
| 2017/0192474 A1 | 7/2017 | Robinson et al. |
| 2017/0331325 A1 | 11/2017 | Ristau |
| 2018/0033097 A1 | 2/2018 | Forbes, Jr. et al. |
| 2019/0027960 A1 | 1/2019 | Agrawal et al. |
| 2021/0006067 A1 | 1/2021 | Donahue et al. |
| 2021/0006073 A1 | 1/2021 | Donahue et al. |
| 2021/0203158 A1 | 7/2021 | Donahue et al. |
| 2021/0367425 A1 | 11/2021 | Donahue et al. |

FOREIGN PATENT DOCUMENTS

| | | |
|---|---|---|
| WO | WO 2014/062383 A1 | 4/2014 |
| WO | WO 2016/040196 A1 | 3/2016 |

OTHER PUBLICATIONS

Gold, Rachel, et al., "Leveraging Advanced Metering Infrastructure to Save Energy," Jan. 9, 2020, Leveraging Advanced Metering Infrastructure to Save Energy; downloaded from https://aceee.org/leveraging-advance-metering-infrastructure-save.

SDG&E Earns Patents for Invention Making it Easier to go Solar, Jan. 4, 2018, downloaded from http://www.sdgenews.com/article/sdge-earns-patents-invention-making-it-easier-go-solar.

St. John, Jeff, "Why Most US Utilities are Failing to Make the Most of Their Smart Meters," Jan. 10, 2020, downloaded from https://www.greentechmedia.com/articles/read/why-most-us-utilities-arent-making-the-most-of-their-smart-meters.

Vossos, V., et al., "Review of DC Power Distribution in Buildings: A Technology and Market Assessment," May 2017; https://escholarship.org/uc/item/2dd536pl.

International Search Report and Written Opinion dated Dec. 1, 2020, for International Application No. PCT/US20/36802, 16 pages.

GRID-TIED ELECTRIC METER ADAPTER AND SYSTEMS FOR AUTOMATED POWER RESILIENCE AND ON-DEMAND GRID BALANCING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

This disclosure relates to renewable energy systems and further relates to the renewable energy systems operating independently from the electrical power grid, herein after the "grid."

Electricity supplied to a home can come from various sources, for example, an electrical grid and a local secondary energy source (renewable energy source), such as a solar panel or a wind turbine, to maintain a reliable electricity supply. The local secondary energy source can be tied to the electrical grid, which is called a grid tied system. Because of constant connection between the local secondary energy source and the electrical grid, the grid tied system de-energizes and ceases production and distribution of power from the local secondary energy source to the electrical grid or its associated facility whenever the electrical grid goes down. This shutdown requirement for all grid tied inverters is defined in National Electric Code, ANSI/UL 1741, California Rule 21, and IEEE 1547.

The electricity from the electrical grid is supplied with a predetermined frequency, for example, approximately 50 Hz in Europe and approximately 60 Hz in North America. However, some appliances and equipment in the home or business can be operated with a frequency over or below the predetermined frequency. Thus, the frequency of the electricity supplied to the home or business can vary from the predetermined frequency.

SUMMARY

The innovations described in the claims each have several aspects, no single one of which is solely responsible for the desirable attributes. Without limiting the scope of the claims, some prominent features of this disclosure will now be briefly described.

Any combination of features described in provisional applications can be implemented in combination with aspects described herein. Moreover, any combination of features described in two or more of the provisional applications can be implemented together. As a non-limiting example, any of the features included in one of the provisional applications can be combined with any of the features included in one or more of the other appendices, as appropriate.

During a grid energy outage, even a facility equipped with the local secondary energy source will be without power because an inverter to which the local secondary energy source is connected cannot produce power without the presence of an electrical grid reference voltage and frequency to prevent back feeding the de-energized grid. This shutdown requirement for all grid tied inverters is defined in National Electric Code, ANSI/UL 1741, California Rule 21, and IEEE 1547.

Aspects of a micro grid in a box (MIB) or adapter that can be used in a grid tied solar or storage (battery) or grid tied solar and battery system with a utility meter, including the smart meter, with or without a remotely or automatically controlled grid "Service Disconnect" switch are described herein. The MIB can be located electrically and physically behind the utility or energy provider's electric meter. The MIB or adapter can isolate a secondary power system, such as grid-tied solar system or a battery system from the electric grid, prevent the isolated or islanded secondary power system from feeding power back into the grid, and permit the secondary power system to supply power to the facility. The advantages are that the facility can continue to receive power from the secondary power source associated with the facility when the electric grid is not supplying power.

An aspect of a micro grid system can comprise an adapter, a power controller, and a secondary energy source. The adapter is in communication with an electric grid and configured to connect and disconnect a connection between the electric grid and a micro grid. The power controller is in communication with the adapter and is configured to receive first AC power from the electric grid via the adapter, obtain grid information, and control the adapter to connect and disconnect the connection between the electric grid and the micro grid. The power controller comprises a processor and a memory configured to store instructions that, when executed, cause the processor to control the adapter to disconnect the connection in response to determining that the electric grid is abnormal based on the grid information. The secondary energy source is in communication with the power controller and configured to generate DC power and to supply the DC power to the power controller. The power controller is further configured to convert the generated DC power from the secondary energy source to second AC power and to supply the second AC power to loads in communication with the power controller responsive to a determination that the electric grid is abnormal.

The adapter can comprise a connection switch and a safety switch, the connection switch being configured to connect and disconnect the connection between the electric grid and the micro grid based on one or more control signals from the power controller and the safety switch being configured to send a connection status signal to the power controller to notify the power controller of grid status, wherein the grid status indicates i) that the electric grid is in electrically connected to the micro grid or ii) that the electric grid is electrically disconnected from the micro grid.

The connection switch and the safety switch can be mechanically linked to cause the connection switch and the safety switch operate together.

The power controller can be further configured to check the connection between the electric grid and the micro grid using the safety switch after controlling the adapter to disconnect the connection.

The micro grid system can further comprise a sensor configured to sense the grid information including at least one of current, voltage, and energy on a path between the electric grid and the micro grid.

The adapter can comprise the sensor. The adapter can comprise a connector, the connector being configured to be coupled with a grid meter. The power controller can comprise an inverter configured to convert the DC power from the secondary energy source to the second AC power and to modify frequency of the second AC power. The micro grid system can further comprise a wireless communication device configured to communicate with an external device and wherein the power controller obtains the grid information using the wireless communication device.

An aspect of method of operating a micro grid system can comprise obtaining grid energy information, determining a status of the electrical grid based on the grid energy information, in response to determining that the grid status is abnormal, disconnecting the connection between the electric grid and the micro grid, and operating the secondary energy source to supply the second AC power to loads associated with the micro grid system responsive to disconnecting the connection between the electric grid and the micro grid. The micro grid system comprising an adapter connected to an electric grid and configured to connect and disconnect a connection between the electric grid and a micro grid, a power controller connected to the electric grid via the adapter and configured to receive first AC power from the electric grid via the adapter, a secondary energy source connected to the power controller and configured to generate DC power and supply the DC power to the power controller for conversion into second AC power, The grid energy information can be obtained by sensing at least one of current, voltage and energy on a path between the electric grid and the power controller. The grid energy information can be obtained by receiving grid information via wireless communication.

The adapter can comprise a connection switch configured to connect and disconnect the connection between the electric grid and the micro grid and wherein the safety switch is configured to send signals to notify the power controller of a status of the connection, the status being that the electric grid and the micro grid are electrically connected or that the electric grid and the micro grid are electrically disconnected.

The method can comprises using the safety switch to verify the status of the connection between the electric grid and the micro grid after controlling the adapter to disconnect the connection. The method can comprises changing frequency of the second AC power supplied to the loads.

An aspect of an adapter can be configured to connect and disconnect connection between an electric grid and a micro grid system. The adapter can comprise a first connector, a second connector, a connection switch, a driver and a safety switch. The first connector can be configured to couple to the electric grid. The second connector can be configured to couple to a utility meter for measuring energy supplied from the electric grid. The connection switch can be configured to connect and disconnect electrical communication between the electric grid and the power controller based at least in part on the measured energy. The driver can be configured to drive the connection switch to connect or disconnect the connection. The safety switch can be mechanically linked to the connection switch, the mechanical linkage causing the safety switch operate in conjunction with the connection switch, a state of the safety switch associated with grid safety relative to operation of the micro grid system.

The adapter can further comprise a sensor configured to sense at least one of current, voltage and energy on a path between the electric grid and a power controller that can be configured to receive AC power from the electric grid via the adapter.

The adapter can be configured to disconnect the connection in response to determining that the at least one of the sensed current, the voltage and the energy is below a predetermined threshold.

The adapter can further comprise a processor and memory configured to store instructions that, when executed, cause the processor to control the driver.

The adapter can comprise a motor mechanically connected to the connection switch and the safety switch, and configured to be driven by the driver, and wherein the driver comprises H motor control circuitry.

Aspects of a variable frequency electronics that can be used in conjunction with a micro grid to supply the load on the micro grid with variable frequency power are described herein. The variable frequency electronics can modify the frequency of the power from the secondary power source that is supplying power to the facility load. Advantageously, reducing the frequency of the power supplied to the load on the facility reduces the power consumed by the load. This increases the efficiency and effectiveness of the secondary power source to provide power to the facility loads. For example, the energy stored in a battery storage system will last longer before it need to be replenished because it is being used more efficiently and more effectively. The variable frequency electronics continuously monitors the variable frequency power and provides adjustments to the frequency for optimum operation as the loads from the facility change. It is important to note that the variable frequency electronics is monitoring and modifying the frequency of the electrical energy supplied from a secondary power source to all of the loads drawing power from the secondary power source. This is different from a variable frequency motor that operates using variable frequency power because the variable frequency electronics monitors and adjusts the frequency based on the varying cumulative load on a facility, as well as attributes of the secondary power, such as current, voltage, and harmonics.

An aspect of a micro grid system can comprise a secondary energy source and a power controller. The secondary energy source can be associated with the micro grid, the secondary energy source configured to generate first DC power signal. The power controller can be in communication with the secondary energy source and an electric grid, and configured to receive first AC power signal from the electric grid and the first DC power signal from the secondary energy source and to output a second AC power signal to loads in communication with the power controller. The power controller can comprise a frequency converter configured to change frequency of the second AC power signal, a processor, and a memory configured to store instructions that, when executed, cause the processor to control the frequency converter to change the frequency of the second AC power signal.

The power controller can be configured to obtain information related to at least one of current, voltage, frequency and harmonic contents of the second AC power signal and to control the frequency converter to change the frequency of the second AC power signal based on the information.

The frequency converter can comprise a first stage comprising an AC-DC converter for converting the first AC power signal into a second DC power signal, and a second stage comprising a bus bar configured to receive the first DC power signal and the second DC power signal, and a first inverter configured to convert at least one of the first and second DC power signals into the second AC power signal for distribution to the loads.

The first stage can comprise a second inverter that is configured to receive the second DC power signal, convert the second DC power signal into a third AC power signal, and supply the third AC power signal into the electric grid.

The power controller can be configured to sense at least one of current, voltage and power on the bus bar, allocate electrons on the bus bar into the secondary energy source, the first inverter, the loads, and the electric grid based at least on the sensing result.

The second stage can comprise pulse width modulation circuitry configured to change a duty cycle of the first DC power signal, the frequency converter configured to change the frequency of the second AC power signal based on the duty cycle of the first DC power signal, and the first inverter is in communication with the secondary energy source via the bus bar and the pulse width modulation circuitry.

The secondary energy source can comprise a first energy source and a second energy source. The pulse width modulation circuitry can comprise first pulse width modulation circuitry configured to change a duty cycle of the first DC power signal from the first energy source and second pulse width modulation circuitry configured to change a duty cycle of the first DC power signal from the second energy source. The processor can be configured to control the first pulse width modulation circuitry and the second pulse width modulation circuitry to synchronize the duty cycles of the first DC power signals from the first and second energy sources.

The micro grid system can comprises an adapter configured to be connected between the electric grid and the micro grid, and configured to connect and disconnect a connection between the electric grid and the micro grid. The power controller can be further configured to control the adapter to disconnect the connection in response to determining that the electric grid is abnormal.

The system can comprise a rechargeable battery connected to the bus bar and configured to store DC energy and to supply the DC energy to the frequency converter via the bus bar.

An aspect of a method of operating a micro grid system can comprise generating a first DC power signal with the secondary energy source, outputting, with the power controller that is configured to receive the first DC power signal from the secondary energy source and a first AC power signal from the electric grid, a second AC power signal to be supplied to loads associated with the micro grid system, modifying frequency of the second AC power signal. The modifying the frequency of the second AC power signal can include obtaining characteristics of the second AC power signal on a path between the power controller and the loads, calculating load to be operated based on the characteristics, generating, with the power controller, a control signal based on the calculated load, and modifying, with a frequency converter, the frequency of the second AC power signal supplied to the loads based on the control signal. The micro grid can comprise a secondary energy source and a power controller in communication with the secondary energy source and an electric grid.

The characteristics of the second AC power signal can comprise at least one of current, voltage, frequency and harmonic contents.

The characteristics of the second AC power signal can be obtained by receiving the characteristics of the second AC power signal via wireless communication.

The frequency of the second AC power signal can be modified by changing a duty cycle of the first DC power signal with pulse width modulation.

The secondary energy source can comprise a first energy source and a second energy source. The frequency converter can comprise first pulse width modulation circuitry configured to change a duty cycle of the first DC power signal from the first energy source and second pulse width modulation circuitry configured to change a duty cycle of the first DC power signal from the second energy source. The method can further comprise synchronizing the duty cycles of the first DC power signals from the first and second energy sources.

The method can further comprise obtaining grid energy information associated with the electric grid, determining a state of the electric grid based on the electric grid information, the state being one of normal or abnormal, and in response to an abnormal determination, disconnecting an electrical connection between the electric grid and the micro grid system.

The method can further comprise converting the second AC power signal into the second DC power signal and supplying the second DC power signal to the electric grid.

An aspect of a power controller for operating a micro grid system comprises a frequency converter, a process, and a memory. The micro grid system can comprise a secondary energy source configured to generate a first DC power signal, the power controller in communication with the electric grid and the secondary energy source. The frequency converter can comprise an AC-DC inverter configured to receive a first AC power signal from the electric grid and to convert the first AC power signal to a second DC power signal, and a first inverter configured to convert at least one of the first and the second DC power signals into the second AC power signal and to supply the second AC power signal to loads associated with the micro grid system. The memory is configured to store instructions that, when executed, cause the processor to control the frequency converter to change frequency of the second AC power signal supplied to the loads associated with the micro grid system.

The power controller can further comprises a sensor configured to sense at least one of current, voltage, frequency and harmonic contents of the second AC power signal, and the processor can be configured to control the frequency converter to change the frequency of the second AC power signal based on the at least one of the sensed current, voltage, frequency and harmonic contents.

The frequency converter can further comprise a bus bar in communication with the secondary energy source, the electric grid, and the first inverter, the bus bar being configured to receive the first DC power signal and the second DC power signal and to deliver the first and the second DC power signals to the first inverter.

The controller can further comprise pulse width modulation circuitry configured to change a duty cycle of the first DC power signal, the frequency converter configured to change the frequency of the second AC power signal based on the duty cycle of the first DC power signal, the first inverter in communication with the secondary energy source via the bus bar and the pulse width modulation circuitry.

For purposes of summarizing the disclosure, certain aspects, advantages and novel features are discussed herein. It is to be understood that not necessarily all such aspects, advantages or features will be embodied in any particular embodiment of the invention, and an artisan would recognize from the disclosure herein a myriad of combinations of such aspects, advantages or features.

BRIEF DESCRIPTION OF THE DRAWINGS

Various embodiments will be described hereinafter with reference to the accompanying drawings. The drawings and the associated descriptions are provided to illustrate embodiments of the present disclosure and do not limit the scope of the invention. In the drawings, similar elements have similar reference numerals.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Figure 1:
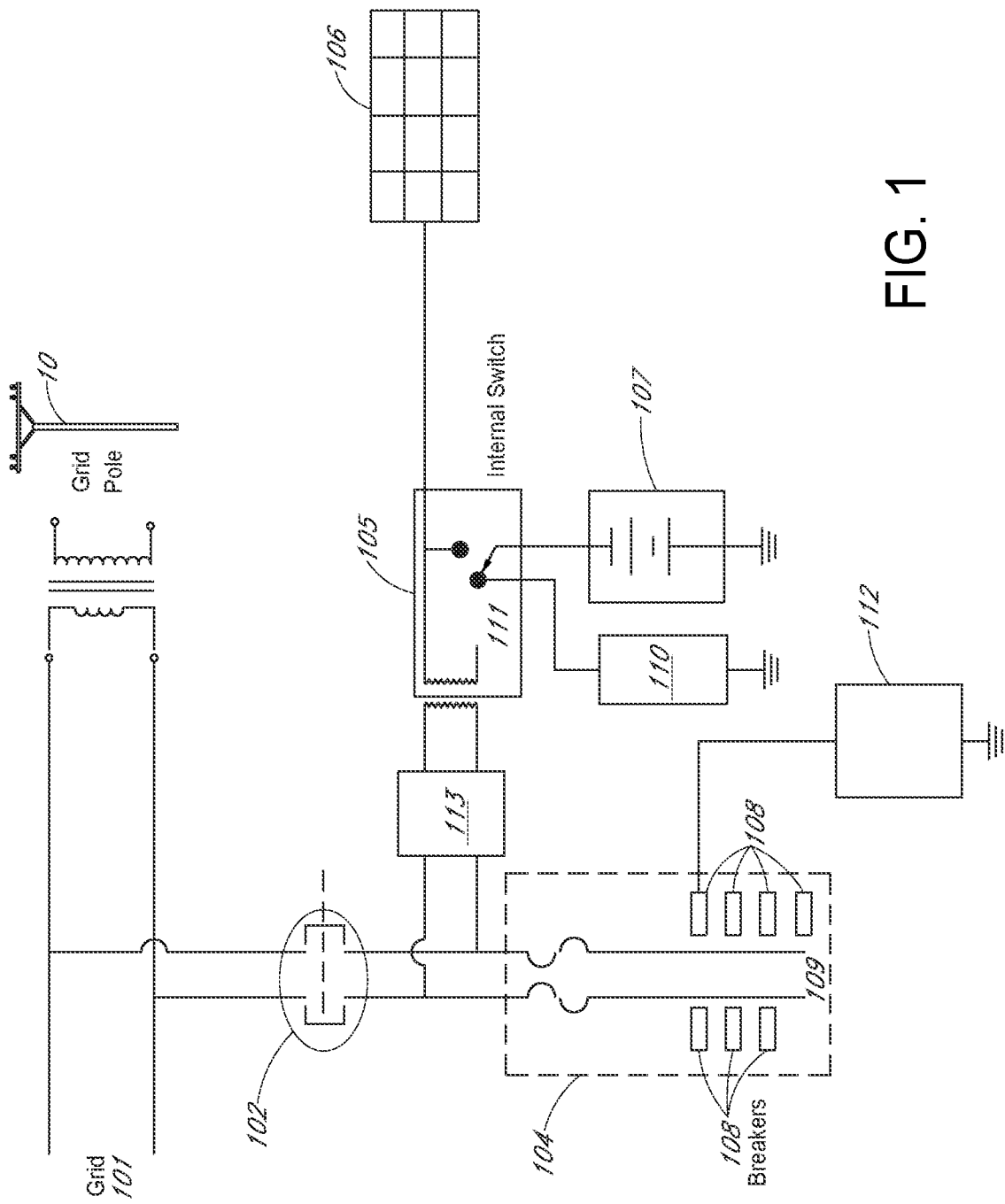
FIG. 1 is a block diagram illustrating an example of a renewable energy system, according to certain embodiments.

FIG. 1 is a block diagram illustrating a renewable energy system, according to certain embodiments. The renewable energy system can comprise a grid 101, and a secondary energy source such as a solar panel 106, a rechargeable battery 107, and a wind turbine 110, for example. The renewable energy system can further comprise an inverter 105, a meter 102, a switch 113, a distribution panel 108 and a load 112. A switch 113 is positioned between the inverter 105 and the distribution panel 104. The grid 101 can receive AC power from a grid pole 10 and deliver the AC power to the distribution panel 104 through a meter 102. The inverter 105 is connected to the secondary energy source. The inverter 105 can include a switch 111 for connecting the wind turbine 110 to the rechargeable battery 107. The inverter 105 can convert DC power to AC power and deliver the AC power to the distribution panel 104. The distribution panel 104 can send the AC power from the grid 101 and/or the inverter 105 to the load 112. The inverter 105 is shut down by the switch 113 when the grid is de-energized. Thus, the renewable energy system cannot use the secondary energy source when there is a grid problem, for example an accidental grid outage or brown out. Further, when the secondary energy source over-generates power, the over-generated power can have negative effects on the distribution panel 104 or the grid 101.

Figure 2A:
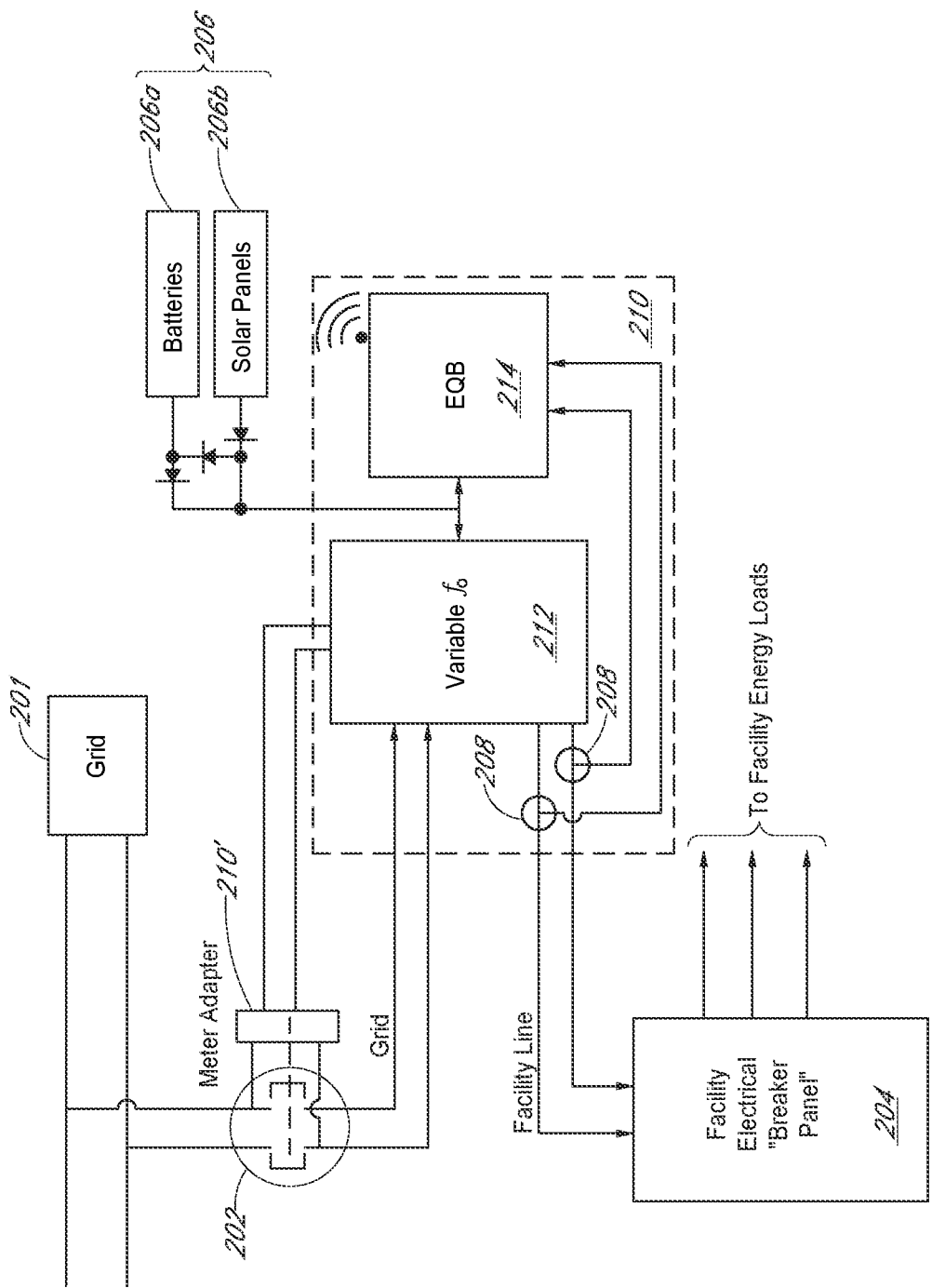
FIG. 2A is a block diagram illustrating an example of a renewable energy system for grid-independent operation, according to certain embodiments.
Figure 2B:
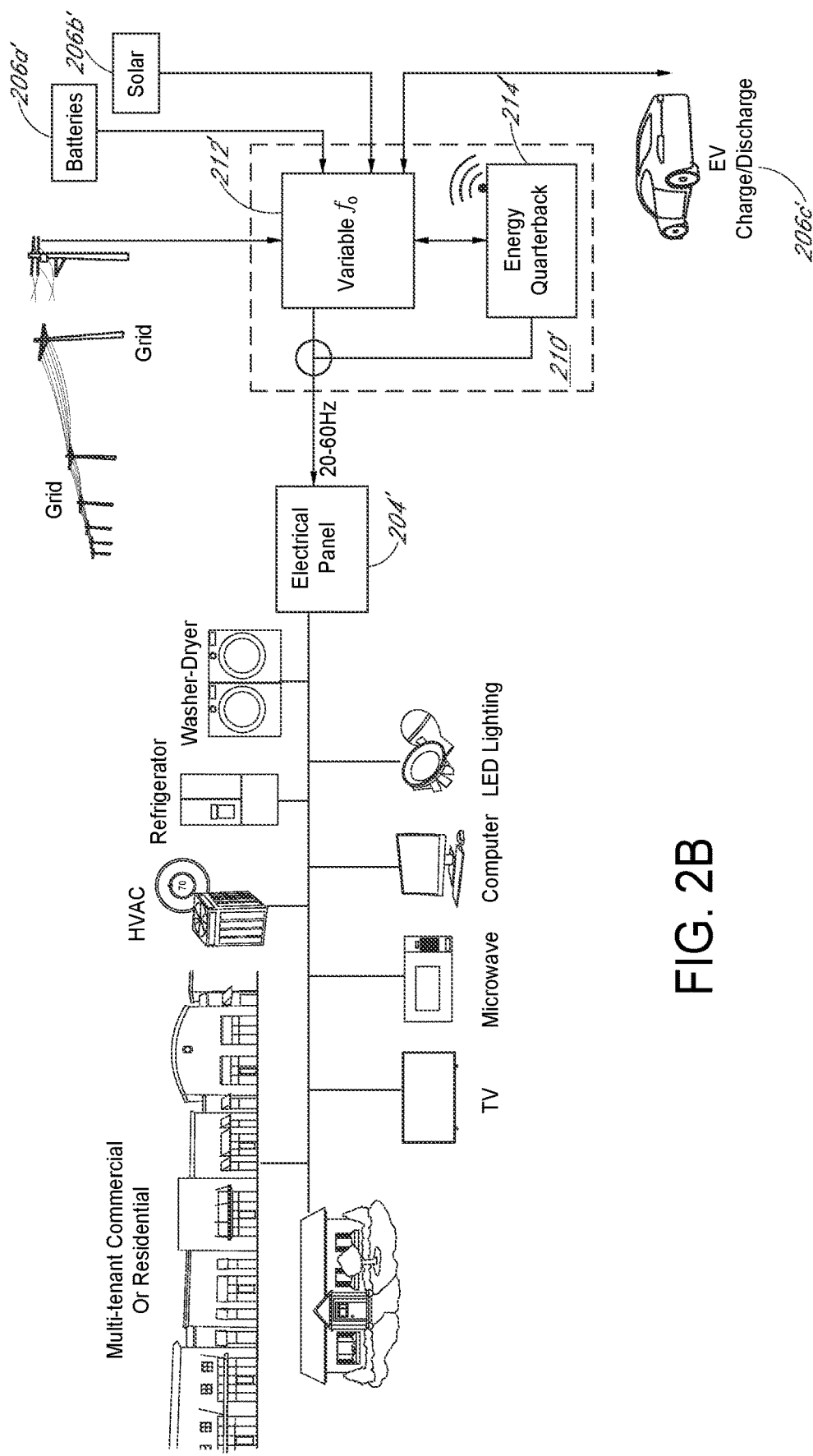
FIG. 2B is a conceptual diagram illustrating an example of a renewable energy system for grid-independent operation, according to certain embodiments.

FIG. 2A is a block diagram illustrating an example renewable energy system for grid-independent operation, according to certain embodiments. The renewable energy system can comprise a grid 201, a meter 202, an adapter 210', a distribution panel 204, a secondary energy source 206, and a power controller 210. In an embodiment, the adapter 210' can be omitted as illustrated in FIG. 2B. The distribution panel 204 can distribute power from the grid 201 and/or the secondary energy source 206 to loads of a facility.

The meter 202 can measure power supplied from the grid 201. The meter 202 can measure a power supplied from the power controller 210. The adapter 210' can be positioned between the grid 201 and the power controller 210. The secondary energy source 206 can comprise a battery 206a and a solar panel 206b. The battery 206a can be used as backup power for the loads. The distribution panel 204 can supply power to loads.

The adapter 210' can connect or disconnect a connection between the grid 201 and the power controller 210. The adapter 210' can connect or disconnect the connection between the grid 201 and the power controller 210 based on inputs from the power controller 210. In an embodiment, the inputs can comprise information related to the grid 201 (outage, wildfire, leakage, etc.). For example, when the grid does not work properly due to outage or leakage, the power controller 210 can detect abnormality of the grid and transmit a signal for disconnecting the connection between grid 201 and the power controller 210. The inputs can be sensed by an internal sensor of the adapter 210'. The inputs can be sensed by an external sensor of the adapter 210'. The inputs can be delivered to the power controller 210 via wireless communication or wired communication. The power controller 210 can be electrically connected to the adapter 210'. The power controller 210 can receive inputs from outside the power controller 210. In an embodiment, the power controller 210 can receive the inputs via wireless communication. In one embodiment, the power controller 210 can sense at least one of current, voltage, frequency and harmonic contents from the grid 201 or receive sensing results sensed by the adapter 210'. The power controller 210 can provide the adapter 210' with connect/disconnect signal to control the connection/disconnection between the grid 201 and the power controller 210. In an embodiment, the adapter can connect/disconnect between the grid 201 and the power controller 210 automatically.

Accordingly, a micro grid system comprising the power controller 210, the secondary energy source 206, the distribution panel 204, and the loads can be operated independently from the grid 201. Advantageously, the micro grid system can prevent back feeding of power from the secondary energy source to the grid 201 and supply the load with electrical energy from the secondary energy source 206. In an embodiment, the adapter 210' can comprise 2PST or 3PST heavy duty power relays for connecting/disconnecting between the grid 201 and the micro grid.

The power controller 210 can receive DC power from the secondary energy source 206. The power controller 210 can sense at least one of current, voltage, frequency, and harmonic contents outputted from the power controller 210. For example, the power controller 210 can include a sensor 208 for sensing at least one of current, voltage, frequency, and harmonic contents outputted from the power controller 210.

The power controller 210 can comprise frequency variable electronics 212 and an energy quarterback 214. The frequency variable electronics 212 can control the frequency of the electrical waveform that provides electricity to power the facility loads. The frequency variable electronics 212 can comprise an inverter and a converter. In an embodiment, at least one of the loads can be directly connected to the frequency variable electronics 212. The frequency variable electronics 212 can receive the power from the grid 201 and supply the power to the distribution panel 204 or the frequency variable electronics 212. The frequency variable electronics 212 can change frequency of the power supplied to the distribution panel 204 or the at least one of the loads. The frequency variable electronics 212 can change frequency of the power supplied to the distribution panel 204 or the at least one of the loads based on inputs from the energy quarterback 214. In an embodiment, the frequency variable electronics 212 can change the frequency of the power into a range of approximately 1 Hz to approximately 100 Hz. In another embodiment, the frequency variable electronics 212 can change the frequency of the power into a range of approximately 10 Hz to approximately 80 Hz. In another embodiment, the frequency variable electronics 212 can change the frequency of the power into a range of approximately 20 Hz to approximately 70 Hz. In another embodiment, the frequency variable electronics 212 can change the frequency of the power into a range of approximately 40 Hz to approximately 70 Hz. Since operation of some loads, such as HAVC compressors, refrigerators, fans, motors, etc., depend on the frequency of the power supplied thereto, the power with changed frequency can have effects on the energy effectiveness of supplied or stored energy. Thus, by changing the frequency of the supplied AC power, the efficiency of the loads can be adjusted to better match the instant available secondary energy availability and available stored energy. The advantages of changing the frequency of the power to the loads are reduced energy loading onto and the effectiveness of varying or fixed secondary energy resources of solar, wind, Fuel Cells, and battery storage systems.

In an embodiment, adjusting frequency variable electronics 212 output current capacity (ampacity) to match connected facility loads by shifting frequency of normalized operation of inverter frequency from approximately 50 Hz or approximately 60 Hz to a range from between approximately 1 Hz to approximately 100 Hz depends on factors including; 1) solar energy output and 2) demand from connected energy loads that are factored into determining inverter frequency of operation to match solar supply with connected load demands.

Figure 12:
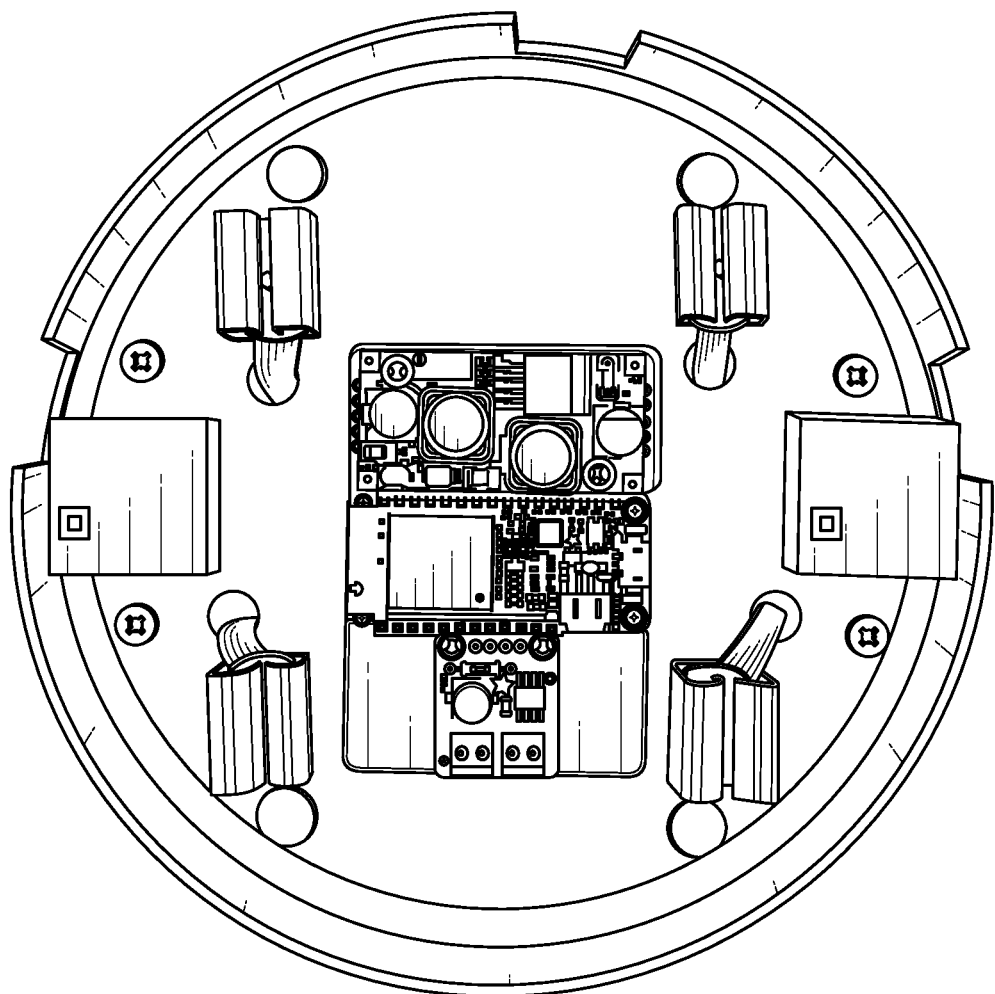
FIG. 12 is an example of an adapter for a renewable energy system for grid-independent operation, according to certain embodiments.

The energy quarterback 214 can comprise at least one of circuitry, a processor, memory, control I/O ports. wireless communication device, a sensor, and a switch. The energy quarterback 214 can comprise cyber secure ICs, cyber secure algorithms, and communication ports. The memory can store at least one of software, firmware, and algorithms. For purposes of illustration, the power controller 210 is illustrated within a dashed box. The frequency variable electronics 212 and the energy quarterback 214 can be separate components. In an embodiment, the energy quarterback 214 can be at least one of algorithms, instructions, and software or a hardware storing them and hardware for executing the at least one of algorithms, instructions, and software. In an embodiment, the energy quarterback 214 can receive instructions remotely and execute the instructions. In an embodiment, the adapter 210' can have a part of the power controller 210. FIG. 12 is an example of an adapter for a renewable energy system for grid-independent operation, according to certain embodiments. As shown in FIG. 12, some integrated circuits and a battery are mounted inside the adapter. The integrated circuits can comprise at least one of a sensor, a processor, and a communication device. The integrated circuits can comprise cyber secure ICs, memory including cyber secure algorithms, and cyber secure communication ports. The communication device can receive outputs from the sensor and transmit data related to the outputs. The outputs can comprise at least one of current, voltage, frequency, and harmonic contents outputted from the power controller 210 or the grid 201. The battery can supply power for the integrated circuits.

The energy quarterback 214 can receive information regarding at least one of current, voltage, frequency, and harmonic contents on a path between the frequency variable electronics 212 and the distribution panel 204. The energy quarterback 214 can provide feedback to the frequency variable electronics 212. The energy quarterback 214 can provide feedback to the frequency variable electronics 212 based on the information. The frequency variable electronics 212 can adjust the frequency of the power supplied to the distribution panel 204 based at least in part on the feedback. Power for the power controller 210 can be supplied from the secondary energy source 206 or an internal battery thereof.

FIG. 2B is a conceptual diagram illustrating an example renewable energy system for grid-independent operation, according to certain embodiments. The renewable energy system can comprise a grid, a distribution panel 204', a secondary energy source such as batteries 206a and solar energy 206b', and a power controller 210'. The distribution panel 204' can distribute power from the grid and/or the secondary energy source to loads of a facility. In an embodiment, the loads can include any electrical load not limited to fans, motors, lights, HVAC, computers, refrigerators, electric stoves, electric hot water heaters, electric heat pumps, computer servers, communication systems, medical devices, electric manufacturing devices and systems, EV chargers, and electrical devices and appliances of all types and varieties commonly or uncommonly associated within or outside of an electrically energized facility. Some loads such as fans, motors, lights, HVAC, a washer-dryer, refrigerators can be operated by AC power. Some loads such as TV, computers, lights can be operated by AC-DC conversion. In an embodiment, the facility may include a fire station, police station, municipal facility, hospital, school, manufacturing facility, data center, cell phone site, apartment building, condo building, or homes.

The power controller 210' can receive various inputs. The inputs can comprise a power from the grid, and a power from the batteries 206a', the solar energy 206b', and an electric vehicle charger 206c'. The power controller 210' can comprise a frequency variable electronics 212' and the energy quarterback 214'. The frequency variable electronics 212' can receive the power from the grid, and the power from the batteries 206a', the solar energy 206b', and the electric vehicle charger 206c', change a frequency of the power and supply the power with changed frequency to the distribution panel. In an embodiment, the power controller 210' can be similar to the power controller 210 illustrated in FIG. 2A.

Figure 3A:
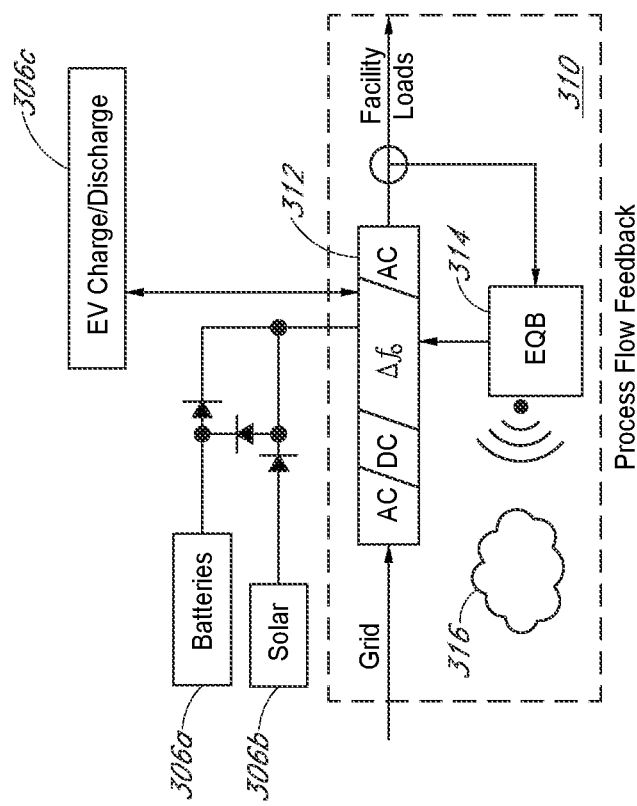
FIG. 3A is a block diagram illustrating an example of a frequency changeable driver for a renewable energy system, according to certain embodiments.

FIG. 3A is a block diagram illustrating an example power controller 310 for a renewable energy system, according to certain embodiments. The power controller 310 can comprise frequency variable electronics 312 and an energy quarterback 314. The power controller 310 can communicate with external devices and receive data related to a grid, a secondary energy source, weather, etc. via wireless communication 316. In an aspect, the power controller 310 receives data over a network, such as the Internet.

The power controller 310 can supply AC power with various frequency to the facility loads. In an embodiment, the frequency variable electronics 312 can supply AC power with various frequency to the facility loads. For example, the frequency variable electronics 312 can supply AC power with a range of approximately 1 Hz to approximately 100 Hz to the facility loads. In another embodiment, the frequency variable electronics 212 can change the frequency of the power into a range of approximately 10 Hz to approximately 80 Hz. In another embodiment, the frequency variable electronics 212 can change the frequency of the power into a range of approximately 20 Hz to approximately 70 Hz. In another embodiment, the frequency variable electronics 212 can change the frequency of the power into a range of approximately 40 Hz to approximately 70 Hz. The energy quarterback 314 can sense at least one of current, voltage, frequency and harmonic contents outputted from the power controller 310 to the facility loads, generate control signals for controlling the frequency variable electronics 312 and provide the control signals to the frequency variable electronics 312. The frequency variable electronics 312 can change the frequency of the power based on the control signal.

In an embodiment, the frequency variable electronics 312 can receive AC power from the grid, convert the AC power into DC power, convert the DC power into AC power having desire frequency and supply to the facility loads the AC power having the desire frequency. In an embodiment, the frequency variable electronics 312 can receive DC power from a secondary energy source such batteries 306a, a solar panel 306b and/or an electric vehicle charge/discharge system 306c, convert the DC power into AC power having desire frequency and supply to the facility loads the AC power having the desire frequency. In an embodiment, when the sensed load is larger than a predetermined threshold, the energy quarterback 314 can control the frequency variable electronics 312 to decrease the frequency of the power supplied to the loads. When the sensed load is smaller than a predetermined threshold, the energy quarterback 314 can control the frequency variable electronics 312 to increase the frequency of the power supplied to the loads.

The power controller 310 can receive information regarding weather, cost, grid factors such as amount of energy, balance of the secondary energy source, and the like via wireless communication 316.

Figure 3B:
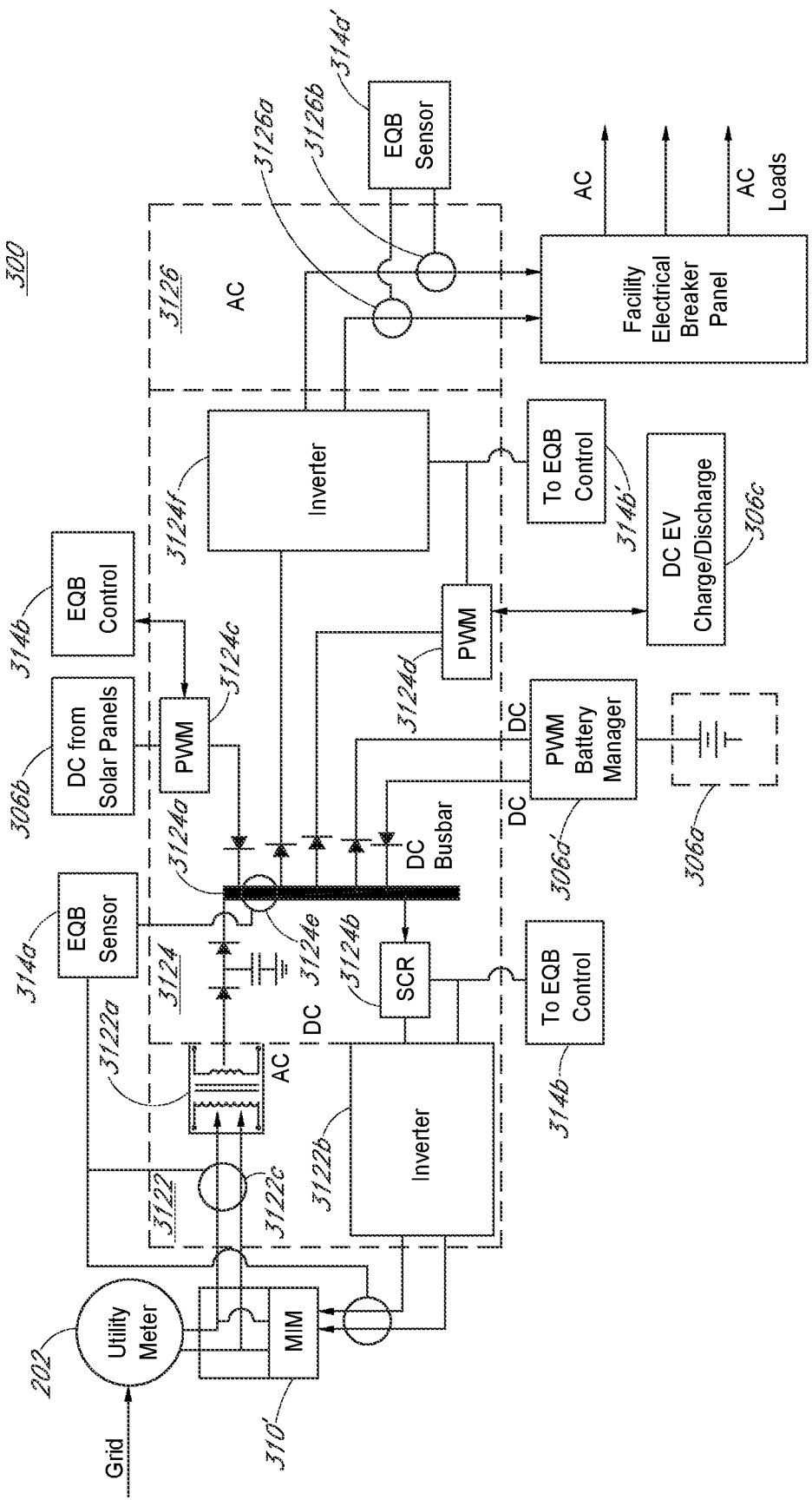
FIG. 3B is a block diagram illustrating an example of a frequency changeable module for a renewable energy system, according to certain embodiments.

FIG. 3B is a diagram illustrating a frequency variable electronics 300 for a renewable energy system, according to certain embodiments. At least one configuration of the frequency variable electronics 300 can be used for the systems illustrated in FIGS. 2A, 2B, and 3A. The frequency variable electronics 300 can be connected to the grid via a meter 202, an adapter 310', a distribution panel (or loads), a secondary energy source such as a solar panel 306b, a battery 306a, an electric vehicle charger 306c, and an energy quarterback (not illustrated). The meter 202 can measure a power supplied to the frequency variable electronics 300 from the grid 202. The adapter 310' can measure the power from the frequency variable electronics 300 to the grid 202. The frequency variable electronics 300 can receive AC power from the grid 202. The frequency variable electronics 300 can receive DC power from a battery 306a, a solar panel 306b and/or an electric vehicle charger 306c.

In an embodiment, the frequency variable electronics 300 can comprise analog or digital AC signal generating circuits. The frequency variable electronics 300 can provide approximately 1 Hz to approximately 100 Hz or other preselected frequencies and voltages.

The frequency variable electronics 300 can comprise a first stage 3122, a second stage 3124, and a third stage 3126. The first stage 3122 can comprise an AC-DC converter 3122a and a DC-AC inverter 3122b. The AC-DC converter 3122a and the DC-AC inverter 3122b are positioned between the grid 202 and the second stage 3124. The first stage 3122 can receive AC power from the grid 202, convert the AC power to DC power using the AC-DC converter 3122a, and transmit the DC power to the second stage 3124. The first stage 3122 can receive DC power from the second stage 3124, convert the DC power from the second stage 3124 to AC power using the DC-AC inverter 3122b, and transmit the AC power to the grid 202. The energy quarterback can sense at least one of current, voltage, power at a path 3122c between the AC-DC converter 3122a and the grid 202. The energy quarterback can send on/off signal to the adapter 310' to connect/disconnect a connection between the frequency electronics 300 and the grid 202.

The second stage 3124 can comprise a bus bar 3124a, a rectifier 3124b, first pulse width modulation circuitry 3124c, second pulse width modulation circuitry 3124d, and a frequency variable inverter 3124f. The second stage 3124 can comprise the third pulse width modulation circuitry 306a'. The AC-DC converter 3122a is connected to the bus bar 3124a. One end of the rectifier 3124b can be connected to the DC-AC inverter 3122b and the other end of the rectifier 3124b can be connected to the bus bar 3124a. In an embodiment, the rectifier 3124b can comprise a silicon-controlled rectifier (SCR). The rectifier 3124b can be controlled by the energy quarterback. For example, the energy quarterback can turn on or off the rectifier 3124b to control energy supply to the grid 202. High power steering diodes are depicted to control the flow of DC electrons, however this is non-limiting and should also embody the option of SCRs or other solid state switching devices that are controlled by the energy quarterback logic and control circuitry. The energy quarterback can determine whether the frequency variable electronics 300 supplies the AC power to the grid 202. The bus bar 3124a is connected to the solar panel 306b via first pulse width modulation circuitry 3124c, the electric vehicle charger 306c via the second pulse width modulation circuitry 3124d, the battery 306a via a third pulse width modulation circuitry 306a', and the frequency variable inverter 3124f. Diodes can be connected between the bus bar 3124a and the respective solar panel 306b, the electric vehicle charger 306c, the battery 306a, and the frequency variable inverter 3124f to block undesirable flow of the DC power as illustrated in FIG. 3B. For example, the solar panel 306b can supply DC power to the bus bar 3124a. The battery 306a can receive DC power from and/or supply DC power to the bus bar 3124a. The bus bar 3124a can supply DC power to the frequency variable inverter 3124f. The bus bar 3124a can supply DC power to the electric vehicle charger 306c.

The first pulse width modulation circuitry 3124c and the second pulse width modulation circuitry 3124d can receive control signal 314b, 314b' from the energy quarterback, respectively. The first pulse width modulation circuitry 3124c and the second pulse width modulation circuitry 3124d can change frequency (on/off duty cycle) of the DC power from the solar panel 306b and the electric vehicle charger 306c, respectively. The third pulse width modulation circuitry 306a' can receive control signal from the energy quarterback. The third pulse width modulation circuitry 306a can adjust frequency of the DC power from the battery 306a. In an embodiments, at least one of the first, the second, and the third pulse width modulation circuitry 3124c, 3125d, 306a' can be an internal circuitry of the frequency variable electronics 300 or an external circuitry of the frequency variable electronics 300.

The energy quarterback can sense at least one of current, voltage, frequency, and harmonic contents on a path 3124e of the bus bar 3124b. In an embodiment, the energy quarterback can generate control signals for determining allocations of energy (or power) of the frequency variable electronics 300 based on sensing results on the path 3124e and provide the control signals to the frequency variable electronics, e.g., to at least one of the first, the second and the third pulse width modulation circuitry 3124c, 3125d, 306a', the SCR 3124b, and the frequency variable inverter 3124f. For example, the energy quarterback can compare the sensing results with a threshold to generate the control signals. The energy quarterback can compare the sensing results with at least one of loads, a power generated by the secondary energy source, a power from the grid, etc., to generate the control signals. In an embodiment, the sensing results on the path 3124e can be a factor for the control signals.

In an embodiment, the first, the second, and the third pulse width modulation circuitry 3124c, 3124d, 306a can be operated to synchronize the frequencies of the powers supplied to the frequency variable inverter 3124f based on the control signal from the energy quarterback. The frequency variable inverter 3124f can convert received DC power into AC power and provide the AC power to the third stage 3126. In an embodiment, when frequency (on/off duty cycle) of the DC power can be adjusted by at least one of the first, the second, and the third pulse width modulation circuitry, frequency of power outputted from the frequency variable inverter 3124f can be adjusted. That is to say, the combination of the pulse width modulation circuitry 3124c, 3125d, 306a', the energy quarterback, and frequency variable inverter 3124f can supply AC power with various frequency.

At stage 3126, the energy quarterback can sense facility loads connected to the frequency variable electronics 300. The energy quarterback can generate feedback signals based on at least one of current, voltage, frequency, harmonic contents between the frequency variable electronics 300 and the distribution panel or loads. The energy quarterback can generate feedback signals (the control signal) and transmit the feedback signal to the first, the second, and the third pulse width modulation circuitry 3124c, 3124d, and 306a'. In an embodiment, the second energy source can supply power (or energy, current, voltage) to the frequency variable inverter 3124f via bus bar 3124a. In an embodiment, the second energy source can supply power (or energy, current, voltage) to the frequency variable inverter 3124f not via the bus bar 3124a. In an embodiment, the secondary energy source can supply power to or receive power from the bus bar 3124a.

In an embodiment, the frequency variable electronics 300 can comprise diodes. For example, diode can be connected between the bus bar 3124a the solar panel 316b, the battery 306a, the electric vehicle charger 306c, and the frequency variable inverter 3124f, respectively. The bus bar 3124a can receive DC power from solar panel 306b and battery 306a, and supply the DC power to the inverter 3124f, the electric vehicle charger 306c and the battery 306a.

Figure 4:
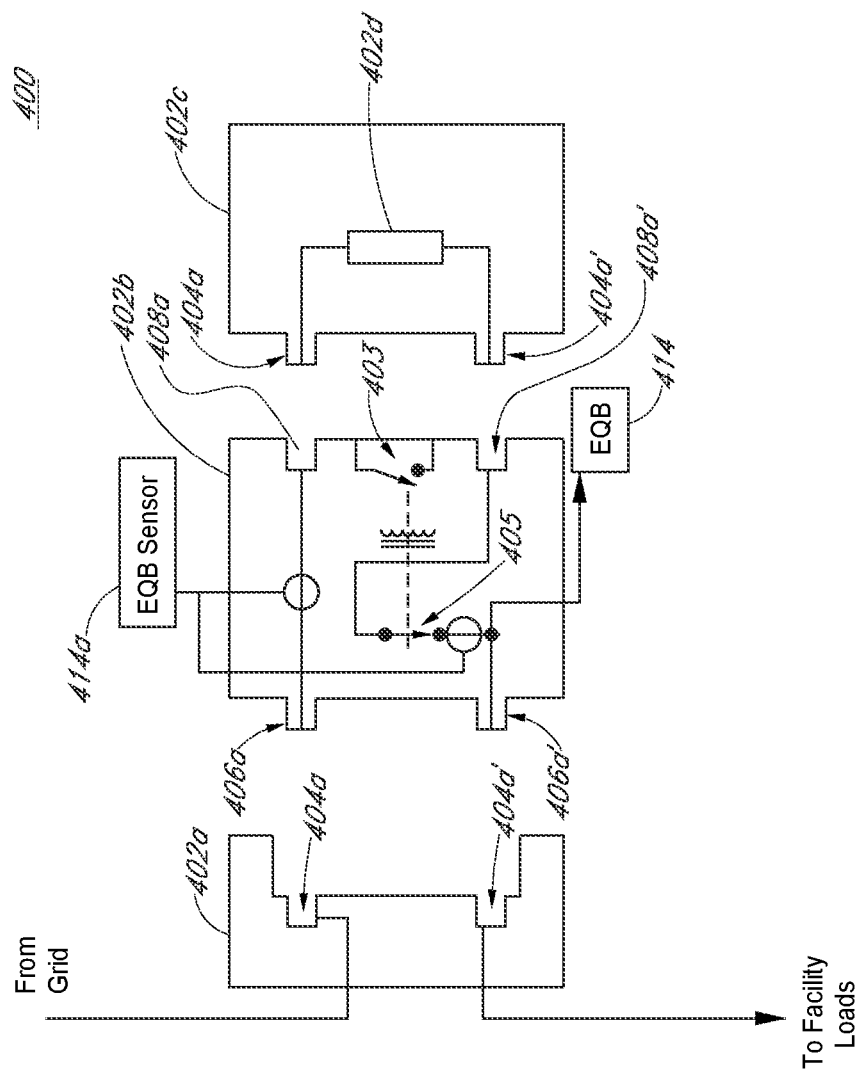
FIG. 4 is a block diagram illustrating an example adapter module for grid-independent operation, according to certain embodiments.

FIG. 4 is a block diagram illustrating an example adapter module 400 for grid-independent operation, according to certain embodiments. At least one configuration of the adapter module 400 can be used for the adapter 210', 310' in FIG. 2A and FIG. 3B, respectively.

The adapter module 400 can comprise a first housing 402a, an adapter 402b, a second housing, and a meter 402d. The first housing 402a can comprise a first connector such a grid side socket 404a and a facility side socket 404a'. The second housing 402c can comprise a second connector such as a first meter plug 404a and a second meter plug 404a'. The grid side socket 404a can be coupled with the first meter plug 404a. The facility side socket 404a' can be coupled with the second meter plug 404a'. Without the adapter 402b, the first housing 402a and the second housing 402c can be coupled with each other. The grid and the facility load can be electrically connected to each other when the first housing 402a and the second housing 402c are coupled with each other. The meter 402d can measure amount of power supplied from the grid to the facility loads.

The adapter 402b can comprise a connector such as a grid side plug 406a, a facility side plug 406a', a first meter socket 408a, and a second meter socket 408a'. The grid side plug 406a and the facility side plug 406a' can be coupled with the grid side socket 404a and the facility side socket 404a', respectively. The meter socket 408a and the second meter socket 408a' can be coupled with the first meter plug 404a and the second meter plug 404a, 404a', respectively. The grid and the facility load can be electrically connected to each other via the adapter 402b. The adapter 402b can be connected to the power controller (not illustrated) or the energy quarterback 414. The energy quarterback 414 can be connected to a secondary energy source (not illustrated). The energy quarterback 414 can comprise a sensor 414a for sensing at least one of current, voltage and frequency, and harmonic contents of power from the grid.

The adapter 402b can comprise a connect/disconnect switch 405 and a safety switch 403. In an embodiment, the connect/disconnect switch 405 can include 2PST (2 phase) or 3PST (3 Phase) switches. The safety switch 403 can be configured to open and close (short). The sensor 414a can further sense at least one of current, voltage and frequency of power between the connect/disconnect switch 405 and the facility loads. The connect/disconnect switch 405 can connect or disconnect the grid and the facility load. In an embodiment, the energy quarterback 414 can recognize status of the connection between the grid and the facility loads based on signals from the safety switch 403. The safety switch 403 can be a sensor sending different signals according to its open state and close state. For example, the safety switch 403 can send a signal representing a zero (0) to the energy quarterback 414 to indicate that the grid is electrically connected to the facility loads. The safety switch 403 can send a signal representing a one (1) to the energy quarterback 414 to indicate that the grid is electrically disconnected from the facility loads. For example, the safety switch 403 is opened when the connect/disconnect switch 405 connects the connection between the grid and the facility load. The safety switch 403 is closed when the connect/disconnect switch 405 disconnects the connection between the grid and the facility load. In an embodiment, the energy quarterback can be connected to the safety switch 403 and sense the open state or closed state of the safety switch 403.

In an embodiment, when the grid is electrically connected to the facility loads, the energy quarterback 414 can maintain synchronization of frequency of power from the grid and the power controller. When the grid is electrically disconnected to the facility loads, the energy quarterback can change frequency of power from the power controller to the facility loads.

In an embodiment, the connect/disconnect switch 405 can comprise a motor driven switch. The connect/disconnect switch 405 can be operated using H-motor control. The safety switch 403 can be mechanically linked to the connect/disconnect switch 405. For example, when the connect/disconnect switch 405 is opened by the motor, the safety switch 403 is also driven to be closed. When the connect/disconnect switch 405 is closed by the motor, the safety switch 403 is also driven to be opened. The connect/disconnect switch 405 can be controlled by the energy quarterback 414.

In an aspect, the connect/disconnect switch 405 can be at least one of 1) a series-wired add-on device for insertion into a meter panel connected to the facility load side of a utility meter, both physically and electrically, 2) configured to accept a meter as plug-in module for series connection on the Facility load side of a meter, and 3) have a connection to the power controller. The connect/disconnect switch 405 can be configured as 2PST, 4PST, or 6PST electro-mechanical or motor driven switching relay or fully electronic power switch consisting of Thyristors, or IGFET, or MOSFET, or SCRs, IGBT, or other solid-state switching devices. The connect/disconnect switch 405 can be configured as a latching 4PST electrical switch for single phase connection. The connect/disconnect switch 405 can be configured as a Latching 6PST electrical switch for 3-phase connection, 1) where 2 of 4 poles of the connect/disconnect switch 405 are wired in series with grid and configured as single-phase grid disconnect. The safety switch 403 can be configured in the same or opposite connection of connect/disconnect switch 405.

Figure 5:
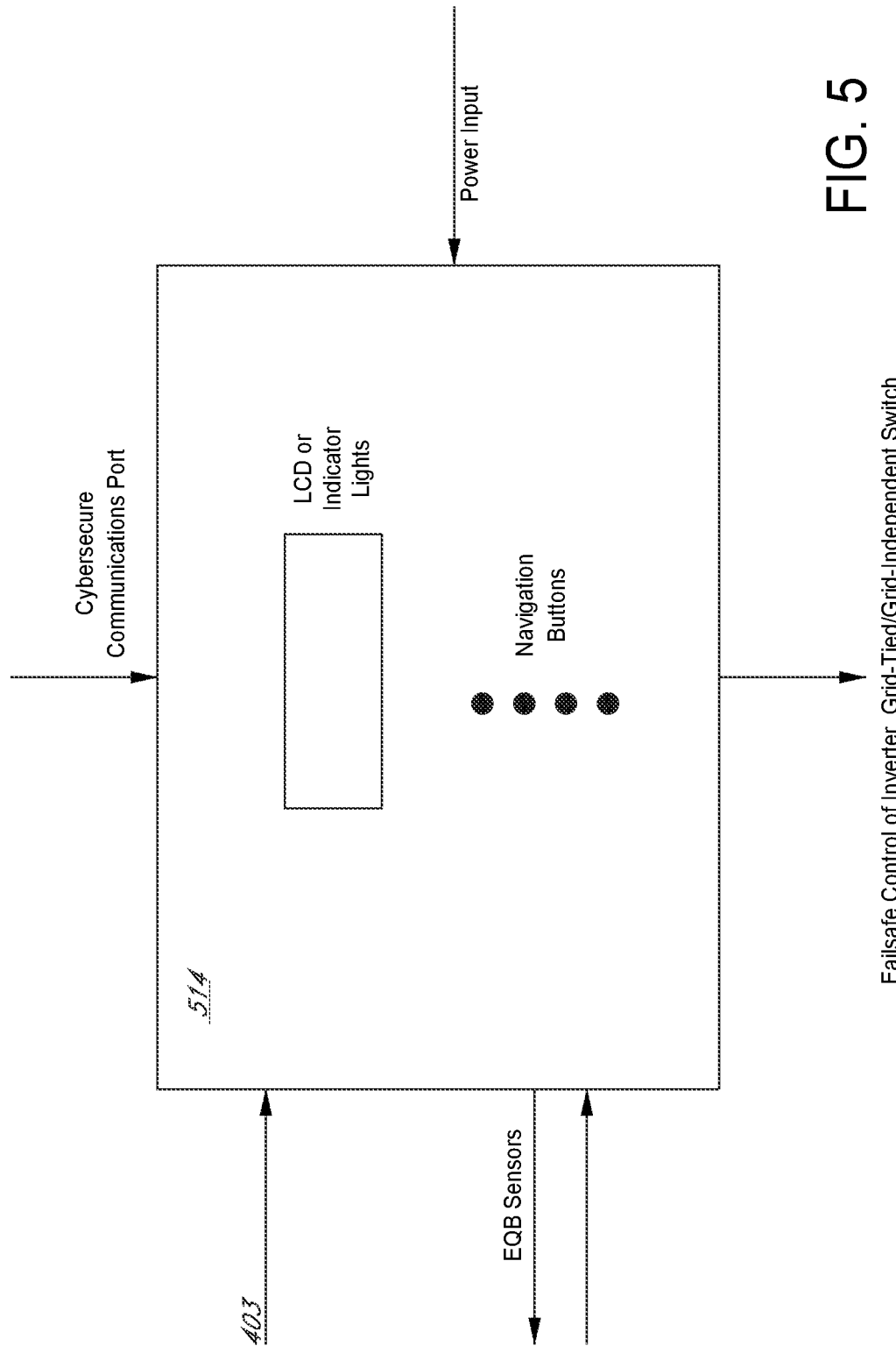
FIG. 5 is a block diagram illustrating an example controller for grid-independent operation, according to certain embodiments.

FIG. 5 is a block diagram illustrating an energy quarterback 514 for grid-independent operation, according to certain embodiments. The energy quarterback 514 can comprise cyber secure integrated circuits, data storage including cyber secure algorithms, and cyber secure communication ports. In an aspect, the energy quarterback 514 can comprise a secure receiver that can be configured as a secure cell phone, secure satellite-based phone, secure land-line phone, car any other secure and pre-cleared communication device. In all cases, these communication systems will include verified and preloaded security clearance authentication that will only allow connection, data input, or data feeds from a highly secure pre-approved wired or wireless communication connection. The energy quarterback can include a secure ROM, configured as EEPROM or other available secure memory options, that is used to verify and permit connections and communications with pre cleared secure data inputs that can be used to access the energy quarterback 514 and its internal CPU, BIOS, systems, ROM, RAM, data loggers, and algorithms.

The energy quarterback 514 can receive inputs from the safety switch 403, and at least one of voltage, energy and current on a path between the grid and the energy quarterback 514. The energy quarterback 514 can use at least one of Bluetooth, cellular connections, WiFi, LTE, 2G, 3G, 4G, or 5G or any wired or wireless protocol to remotely receive data, information, inputs, and signals from or transmit data, information, inputs, and signals to external device, module, switch, and electronics. The communication between the energy quarterback 514 and external device, module, switch, and electronics is secured by the cyber secure integrated circuits, the cyber secure algorithms, and/or the cyber secure communication ports. The energy quarterback 514 can provide the connect/disconnect switch 405 and the frequency variable electronics with control signals based on the data, the information, the inputs, and the signals from external device, module, switch, and electronics. Further, the energy quarterback 514 can receive weather information, grid information, secondary energy source information, etc.

Figure 6:
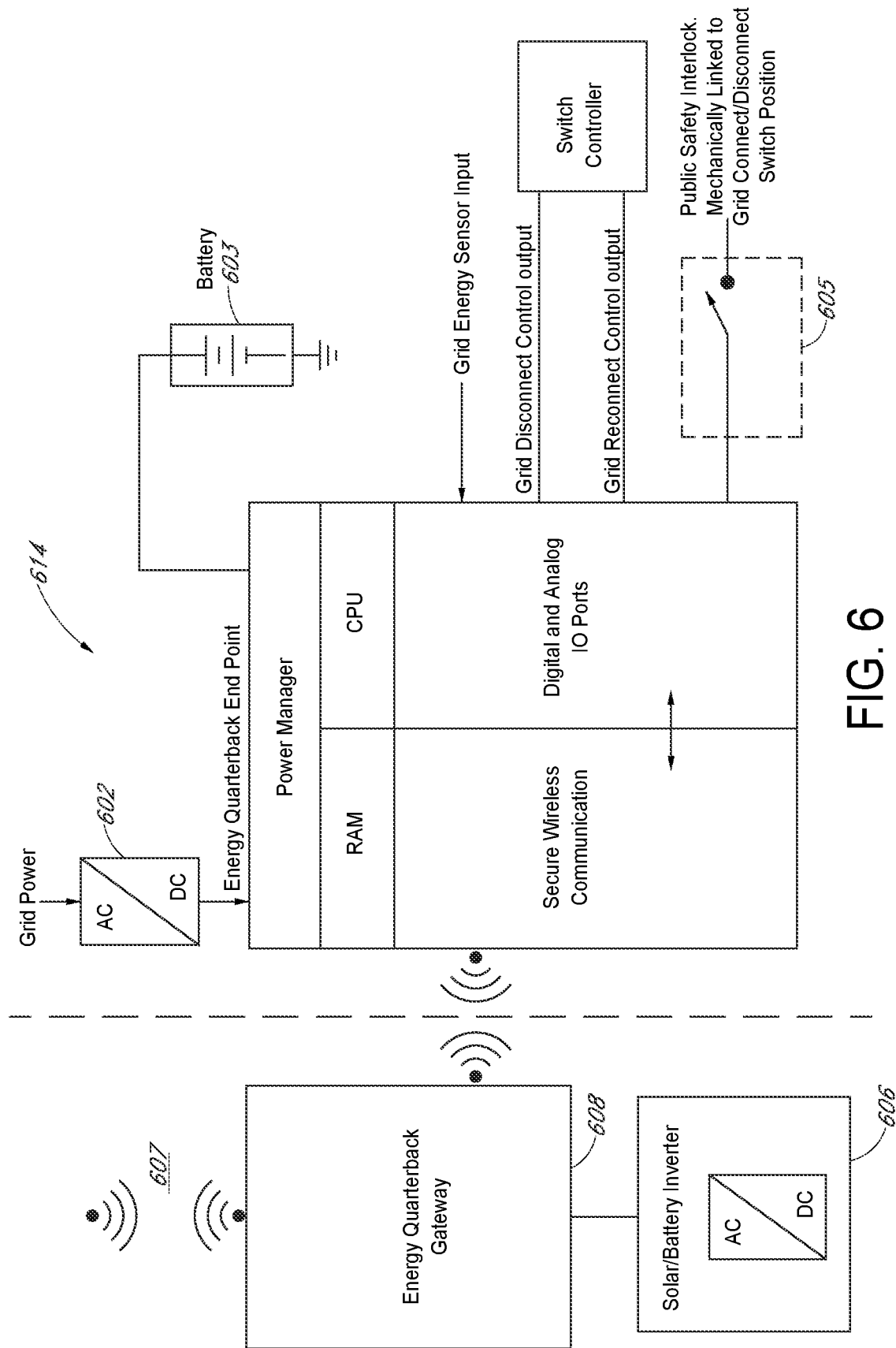
FIG. 6 is a block diagram illustrating another example controller for grid-independent operation, according to certain embodiments.

FIG. 6 is a block diagram illustrating another example energy quarterback for grid-independent operation, according to certain embodiments. Some parts (e.g., energy quarterback end point) of the energy quarterback are positioned separately from the other parts of the energy quarterback as illustrated in FIG. 6. In an embodiment, an energy quarterback end point 614 can comprise memory, a processor, a wireless communication unit and I/O ports. The energy quarterback end point 614 can receive power from grid 602 or battery 603. An energy quarterback gateway 608 can be remotely separate from the energy quarterback end point 614 and can receive inputs, data or information from a third party via wireless communication 607. The wireless communication 607 can comprise at least one of Bluetooth, cellular connections, WiFi, LTE, 2G, 3G, 4G, or 5G or any wired or wireless protocol. The energy quarterback gateway 608 can power from solar panel and/or a battery. The energy quarterback gateway 608 and the energy quarterback end point 614 can receive or transmit inputs, data or information each other. The energy quarterback end point 614 can send control signals to a switch controller for control of the connect/disconnect switch 405. The switch controller can comprise H-motor controller. The energy quarterback end point 614 can receive a signal from the safety switch mechanically linked to the connect/disconnect switch 405.

Figure 7:
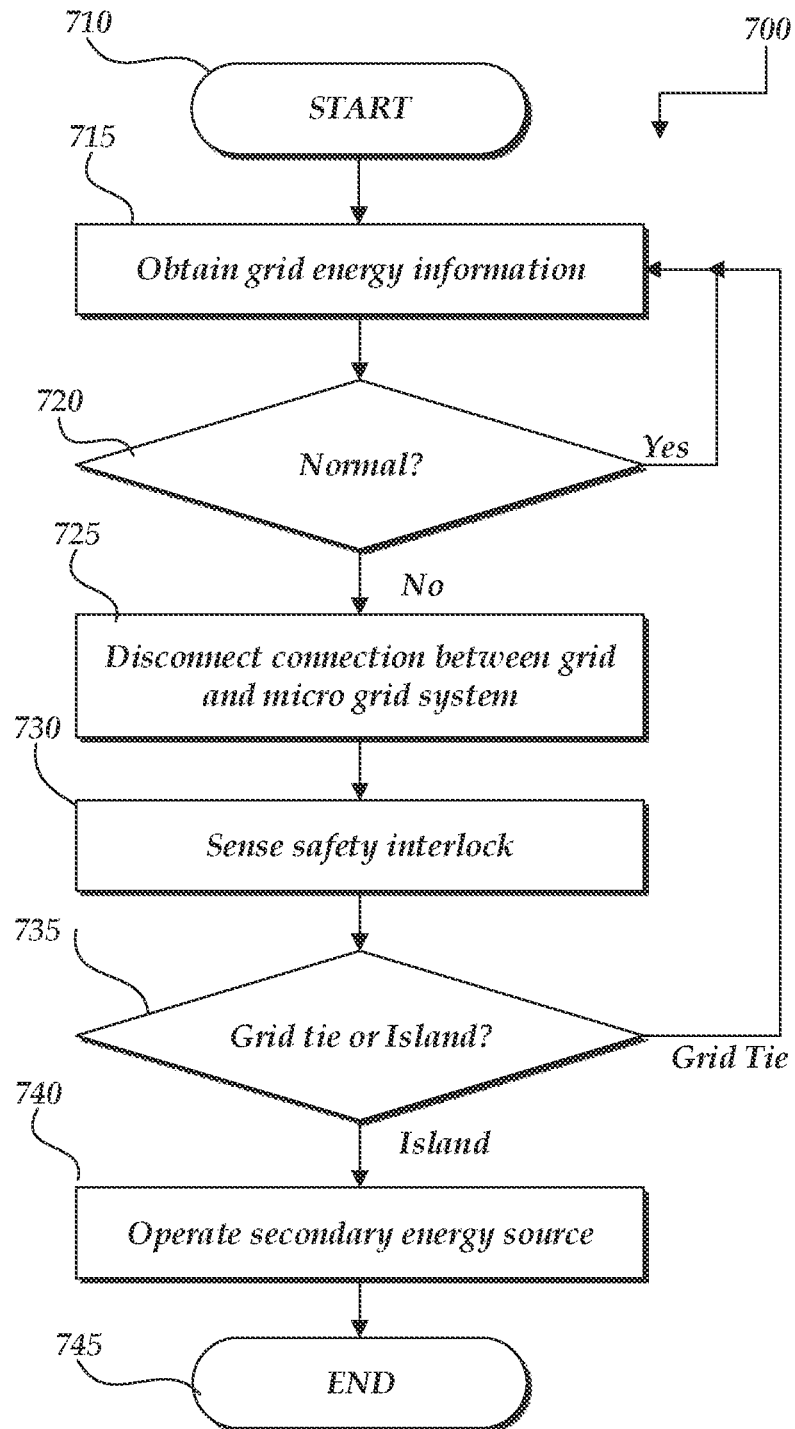
FIG. 7 is a flow diagram illustrating an example operation of a micro grid system for grid-independent operation, according to certain embodiments.

FIG. 7 illustrates an example operation 700 of a micro grid system for grid-independent operation, according to certain embodiments. Beginning at block 710, a micro grid system is operating. The micro grid system can comprise a power controller including a frequency variable electronics and an energy quarterback, a secondary energy source, and facility loads. The micro grid system is electrically connected to a grid. The frequency variable electronics, the energy quarterback, and a secondary energy source can be similar to the frequency variable electronics 212, 212', 312, 300 the energy quarterback 214, 214', 314, 514 and a secondary energy source 206.

At block 715, the micro grid system can obtain grid energy information from the grid. The micro grid system can obtain grid energy information by sensing at least one of current, voltage, power on a path between the grid and the micro grid system. In an embodiment, the micro grid system can receive the grid energy information via network. For example, an external device, user, or another micro grid system can send the grid energy information.

At block 720, the micro grid system determines that grid energy or operation is normal or abnormal based on the grid energy information. In an embodiment, the micro grid system determines that the grid energy is abnormal when the grid energy is smaller than threshold or the micro grid system receives information indicating grid outage.

If it is determined that the grid energy is normal at block 720, the micro grid system returns to block 715 and continues to obtain the grid energy information at block 715. If it is determined that the grid energy is abnormal at block 720, the operation 700 moves to block 725. The micro grid system disconnects a connection between the grid and the micro grid system at block 725. The disconnection can prevent electricity generated from the micro grid system from flowing into the grid. The micro grid system can disconnect the connection between the grid and the micro grid system by sending a control signal to a switch on a path between the grid and the micro grid system.

At block 730, the micro grid system senses a signal from a safety interlock. In an embodiment, the safety interlock can send a signal to the micro grid system to notice whether the micro grid system is tied to the grid or not. If it is determined that the micro grid system is tied to the grid at block 735, the operation 700 can move to block 715 and obtain the grid energy information. If it is determined that the micro grid system is not tied to the grid (islanded) at block 735, the operation 700 can move to block 740. At block 740, the micro grid system operates the secondary energy source to supply power to the facility loads. Since the connection between the grid and the micro grid system is disconnected, the power generated from the secondary energy source cannot flow into the grid.

In an embodiment, at least one operation of blocks 715, 720, 725, 730, 735, 740 can be performed by another device such as another micro grid. Further, at least one of determination at blocks 720 and 735 can be received from or transmitted to an external device. At block 745, the operation 700 ends.

Figure 8:
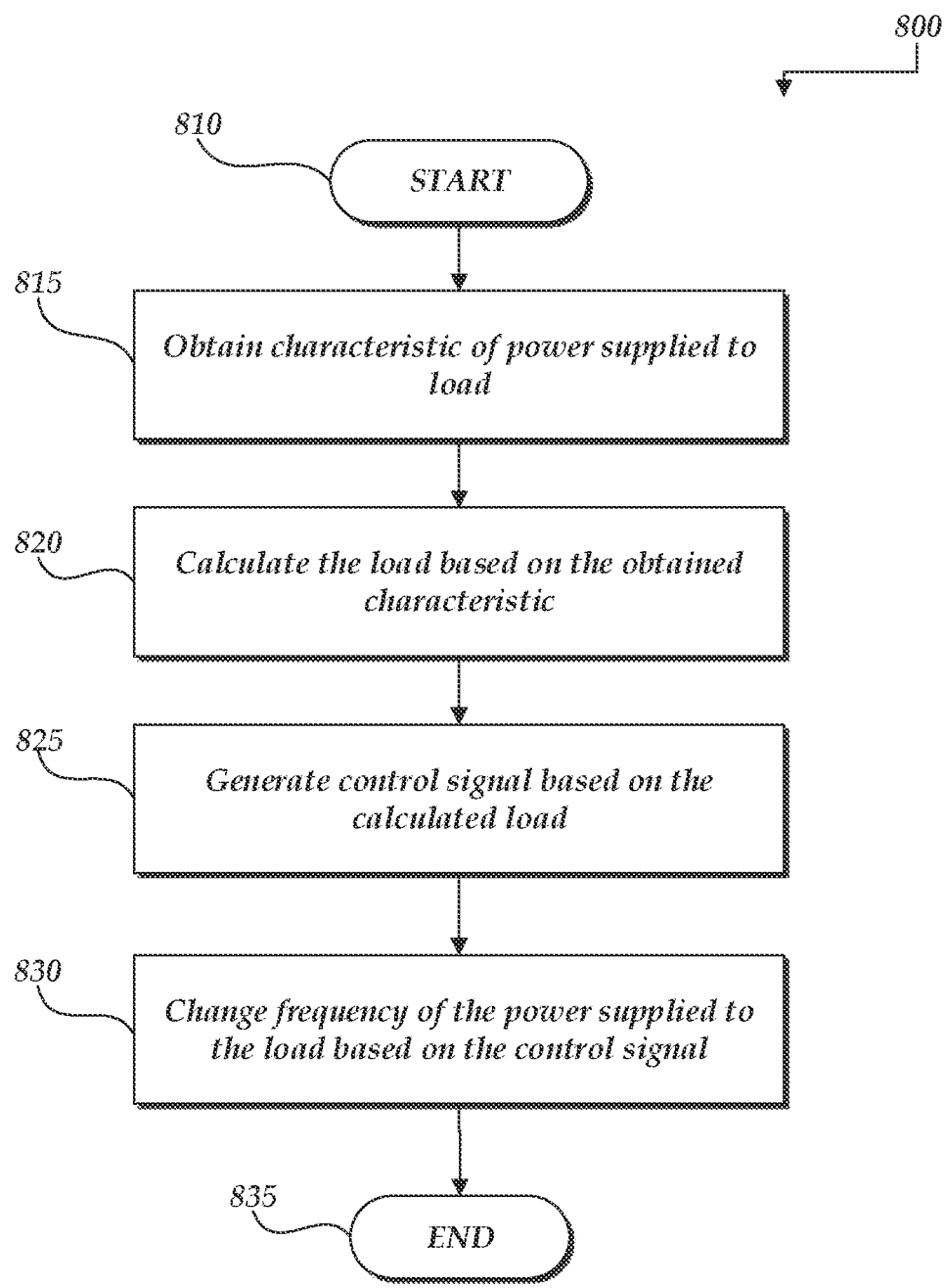
FIG. 8 is a flow diagram illustrating an example frequency change operation of a micro grid system for grid-independent operation, according to certain embodiments.

FIG. 8 illustrates a frequency change operation 800 of a micro grid system for grid-independent operation, according to certain embodiments. The frequency change operation 800 starts at beginning block 810. The micro grid system can comprise a power controller including a frequency variable electronics and an energy quarterback, a secondary energy source, and facility loads. The micro grid system is electrically connected to a grid. The frequency variable electronics, the energy quarterback, and a secondary energy source can be similar to the frequency variable electronics 212, 212', 312, 300 the energy quarterback 214, 214', 314, 514 and a secondary energy source 206.

At block 815, the micro grid system obtains characteristics of power supplied to the load. The characteristics can comprise at least one of current, voltage, frequency and harmonic contents of the power. In an embodiment, an external sensor can send the characteristics to the micro grid. At block 820, the micro grid system calculates the load based on the obtained characteristics. In an embodiment, an external device can send calculated load information to the micro grid. At block 825, the micro grid system modifies or changes frequency of the power supplied to the load based on the control signal. Since operation of some loads, such as HAVC compressors, refrigerators, fans, motors, and the like, depends on the frequency of the power supplied thereto, the power with modified or changed frequency can have effects on the energy efficiency of these devices. In an aspect, reducing the frequency of the power supplied from the secondary power system increases the energy efficiency of the attached loads and thus the corresponding effectiveness of the secondary power system, such that the devices and appliances of the load do not consume as much electrical power as consumed when the frequency of the power supplied to the devices and appliances of the load does not include a reduced frequency. Thus, by changing the frequency of the power, the efficiency of the power consumption of the loads can be adjusted. In an embodiment, least one operation of blocks 815, 820, 825, can be performed another micro grid. At block 830, the operation 800 ends.

Figure 9:
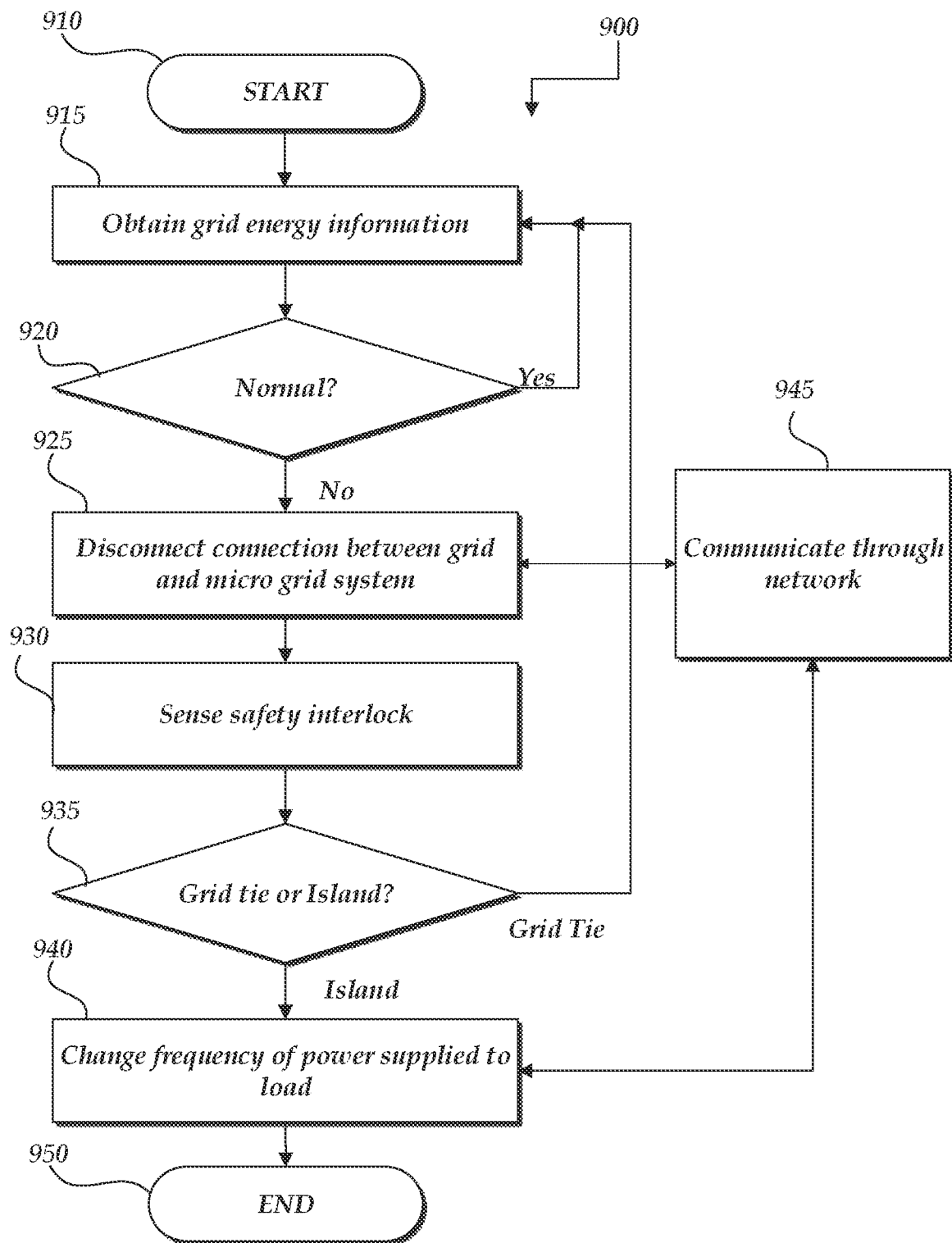
FIG. 9 is a flow diagram illustrating another example operation of a micro grid system for grid-independent operation, according to certain embodiments.

FIG. 9 illustrates another operation 900 of a micro grid system for grid-independent operation, according to certain embodiments. Beginning at block 910, the micro grid system is operating. The micro grid system can comprise a power controller including a frequency variable electronics and an energy quarterback, a secondary energy source, and facility loads. The micro grid system is electrically connected to a grid. The frequency variable electronics, the energy quarterback, and a secondary energy source can be similar to the frequency variable electronics 212, 212', 312, 300 the energy quarterback 214, 214', 314, 514 and a secondary energy source 206.

At block 915, the micro grid system can obtain grid energy information from the grid. The micro grid system can obtain grid energy information by sensing at least one of current, voltage, power on a path between the grid and the micro grid system. The micro grid system can receive the grid energy information via network. For example, an external device, user, or another micro grid system can send the grid energy information.

At block 920, the micro grid system determines that grid energy is normal or abnormal based on the grid energy information. In an embodiment, the micro grid system determines that the grid energy is abnormal when the grid energy is smaller than threshold or the micro grid system receives information indicating a grid outage.

If it is determined that the grid energy is normal at block 920, the micro grid system returns to block 915 and keeps obtaining the grid energy information at block 915. If it is determined that the grid energy is abnormal at block 920, the operation 900 moves to block 925. The micro grid system disconnects a connection between the grid and the micro grid system at block 925. The disconnection can advantageously prevent electricity generated from the micro grid system from flowing into the grid. The micro grid system can disconnect connection between the grid and the micro grid system by sending a control signal to a switch on a path between the grid and the micro grid system.

At block 930, the micro grid system senses a signal from a safety interlock. In an embodiment, the safety interlock can send a signal to the micro grid system to notice whether the micro grid system is tied to the grid or not. If it is determined that the micro grid system is tied to the grid at block 935, the operation 900 can move to block 915 and continue to obtain the grid energy information. If it is determined that the micro grid system is not tied to the grid at block 935, the operation 900 can move to block 940. At block 940, the micro grid system changes frequency of the power supplied to the load based on the control signal. Since operation of some loads, such as HVAC compressors, refrigerators, fans, motors, and the like, depends on the frequency of the power supplied thereto, the power with changed frequency can have effects on the energy use efficiency. Thus, by changing the frequency of the power, the efficiency of the power consumption of the loads can be adjusted. In an embodiment, the micro grid adjusts the frequency to match connected loads by shifting the supplied frequency of power from the approximately 50 Hz or approximately 60 Hz grid frequency of power to a range from approximately 1 Hz to approximately 100 Hz depending on factors including: 1) solar energy output and 2) demand from connected energy loads and 3) the available stored energy that are factored into determining inverter frequency of operation to match solar supply and storage with connected load demands.

Figure 10:
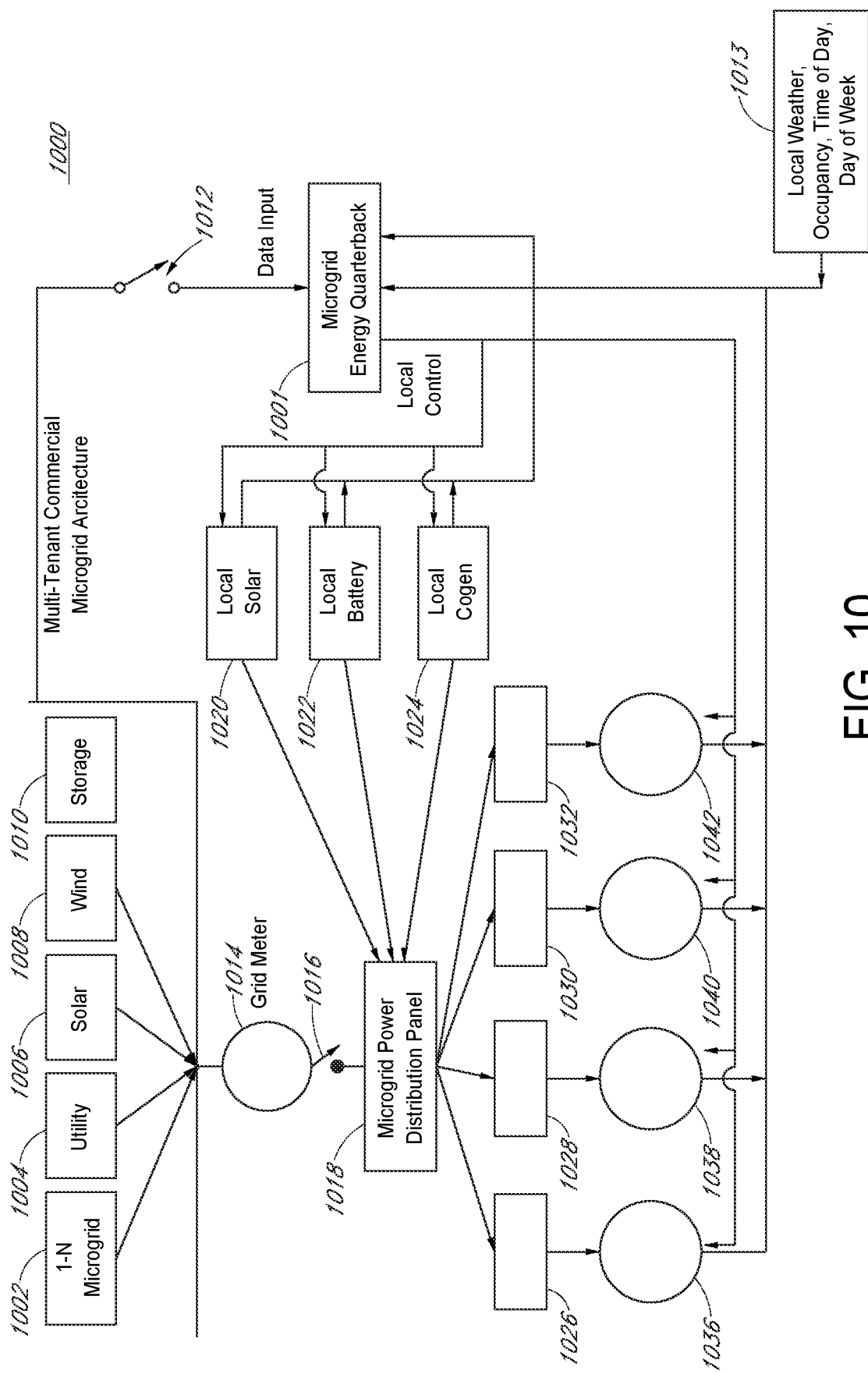
FIG. 10 is a block diagram illustrating an example renewable energy system, according to certain embodiments.

FIG. 10 is a block diagram illustrating another renewable energy system, according to certain embodiments. The renewable energy system illustrated in FIG. 10 can comprise multi tenants 1036, 1038, 1040, 1042, various power sources such as a grid 1002, utility 1004, a solar panel 1006, a wind turbine 1008, and storage 1010, and a secondary energy source such as a local solar panel 1020, a local battery 1022, and a local co-generator 1024, an energy quarterback 1001, and distribution panel 1018.

The distribution panel 1018 can receive powers from the various power sources and the secondary energy source, and provide power each of the multi tenants 1036, 1038, 1040, 10422. The multi tenants 1036, 1038, 1040, 1042 has individual sub-meter 1026, 1028, 1030, 1032 for measuring their power consumption. In an embodiment, the multi tenants can comprise individual homes, businesses, multi-tenant commercial facilities, strip malls, malls, commercial office buildings, and mixed-use facilities.

The energy quarterback 1001 can receive information from the various power sources and the secondary energy source. The information from the various power sources and the secondary energy source can comprise, but not limited to, cost, amount of power, power generation profile, etc. The energy quarterback 1001 can comprise a CPU, BIOS, secure ROM memory. RAM, and SSD that can be connected or disconnected from internal busses and secure communication modules plus local and switched data ports to enhance cybersecurity. The energy quarterback 1001 is capable of automatically switching into an internet isolating mode using a switch 1012. This may be done for security reasons.

To provide grid balancing services, the energy quarterback 1001 can be electrically connected to a grid. The energy quarterback 1001 can constantly balance the various and diverse energy needs of multiple interconnected micro grid energy tenants 1036, 1038, 1040, 1042 with the secondary energy source such as the local solar panel 1020, the local battery 1022, and the local co-generator 1024, energy storage. The energy quarterback 1001 can access the local photo voltaic (PV) solar output, identify battery capacity for store and forward of energy. The energy quarterback 1001 can access local weather, time of day, and occupancy via network 1013, The energy quarterback 1001 can access facility loads of each tenant, such as thermostats, VVR on HVAC and refrigeration motors, smart lighting, smart plug loads, and water heaters.

In an embodiment, storage types and chemistries for the local battery 1022 can include hydrogen production plus storage plus fuel cells, graphene batteries, various lithium ion battery chemistries including but not limited to lithium iron phosphate, and new ceramic batteries including LLZO (lithium, lanthanum, and zirconium oxide) and LGPS (lithium, germanium, phosphorus sulfide), flow batteries or reverse fuel cells with various chemistries including salt or vanadium, zinc air batteries, and other types of battery chemistries that ideally match or closely match various tenant load profiles of various multi-tenant commercial properties.

Figure 11:
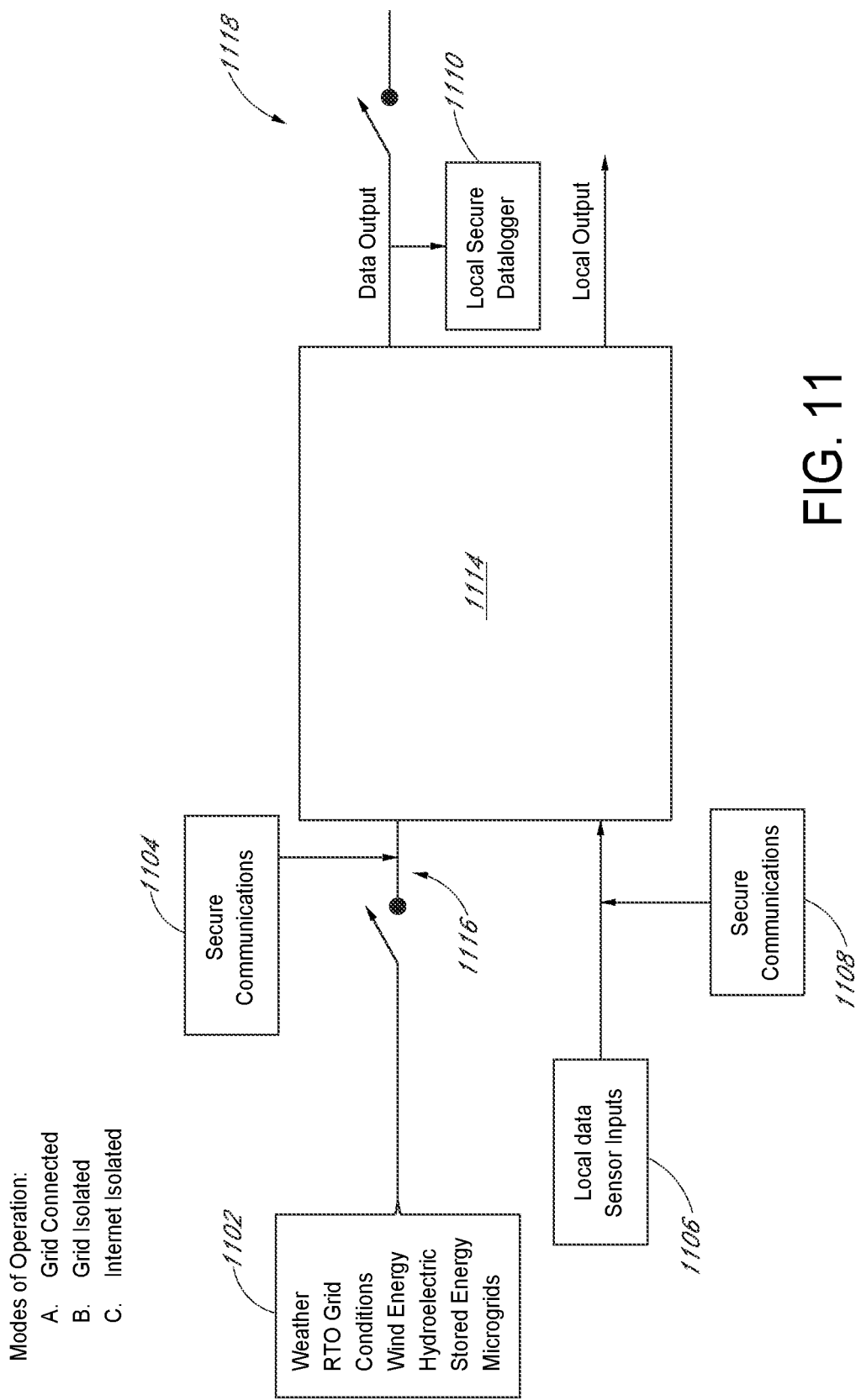
FIG. 11 is a block diagram illustrating an example controller for a renewable energy system, according to certain embodiments.

FIG. 11 is a block diagram illustrating an energy quarterback 1114 for a renewable energy system, according to certain embodiments. The energy quarterback 1114 can comprise secure communications 1104, 1108, 1110. The cyber secure communications 1104, 1108, 1110 can be performed using cyber secure ICs, cyber secure algorithms, and cyber secure communication ports. In an aspect, the energy quarterback 1114 can comprise a secure receiver that can be configured as a secure cell phone, secure satellite-based phone, secure land-line phone, or any other secure and pre-cleared communication device. In all cases, these communication systems will include verified and preloaded security clearance authentication that will only allow connection, data input, or data feeds from a highly secure pre-approved wired or wireless communication connection. The energy quarterback 1114 can comprise a secure ROM, configured as EEPROM or other available secure memory options, that is used to verify and permit connections and communications with pre cleared secure data inputs that can be used to access the energy quarterback 1114 and its internal CPU, BIOS, systems, ROM, RAM, data loggers, and algorithms.

The energy quarterback 1114 can use at least one of Bluetooth, cellular connections, WiFi, LTE, 2G, 3G, 4G, or 5G or any wired or wireless protocol to remotely receive data, information, inputs, and signals from or transmit data, information, inputs, and signals to external device, module, switch, and electronics.

To secure the contents of the energy quarterback 1114, the energy quarterback 1114 can rely on the device or CPU operating system. Depending on the BIOS operating system, there are different authentication measures, drive encryption, RAM encryption, and secure login types that can supplement basic CPU and BIOS. However, relying on an operating system to protect sensitive data and operating mode algorithms may be insufficient to keep data files private. A breach of the operating system (macOS or Windows for example) may compromise files and algorithms. An encrypted hard drive can prevent files and algorithms from being compromised.

Cybersecurity approaches today rely on software patches on vulnerabilities that have already been identified. This is not an ideal solution. Hardware cybersecurity plus internet isolation modes contained within the energy quarterback 1114 are solutions described herein to ensure optimum cybersecurity.

The energy quarterback 1114 can automatically switch into an Internet isolating mode for additional security using one or more of switches 1116, 1110. In the Internet isolating mode, the energy quarterback 1114 does not communicate with the Internet or other cloud system. The energy quarterback 1114 can rely on limited use OS, no emails, no web sites, and convert algorithms into EEPROM ROM that cannot be hacked or remotely accessed. The energy quarterback 1114 has no hardware port vulnerabilities and disarm a large proportion of today's software cybersecurity attacks. Also, according to DARPA, Energy Quarterback will eliminate seven classes of hardware weaknesses: permissions and privileges, buffer errors, resource management, information leakage, numeric errors, crypto errors, and code injection.

Other Embodiments

Some embodiments can comprise use of a meter adapter containing electronic sensors, power supplies, logic, 2PST or 3PST power on/off switches, motor and solenoid H-control circuits, public safety interlock, backup battery, and serial communications to automatically or remotely control on-demand the safe transformation of a grid tied solar and battery system into a grid independent or islanding micro grid, Some embodiments can comprise use of a logic system consisting of CPU, FPGA, discrete logic, Memory, Firmware, GPIOs, ADC, DAC, PWM controllers, cybersecurity chips, and serial communications in an AI Energy Quarterback system to assess, calculate needed energy and storage, and to manage the flow of grid tied and grid independent solar and battery power to serve the local facility needs while also participating in profitable grid balancing needs.

Some embodiments can comprise use of a whole facility DC to AC inverter that is under the control of an artificial intelligence (AI) Feedback and Feedforward Energy Quarterback system that dynamically varies the frequency of power delivered simultaneously to all facility loads distinct from grid power frequencies to achieve optimum facility energy efficiency and effectiveness from every solar and battery stored watt.

Some embodiments can comprise managed use of a local facility's grid AC that is converted to DC power immediately after the utility meter and then combined with DC power from solar plus DC power to and from storage batteries plus DC power to and from EV Chargers. These DC power sources and storage are all combined onto a DC power bus bar to mix DC power from the grid, DC solar, DC storage batteries, and DC EV batteries.

In some embodiments, combining all power sources and stored energy on a DC bus bar eliminates the need for multiple costly DC to AC inverters, enabling a single DC to AC power inverter to be used with dynamic variable frequency power electronics functionality to serve the facility and its loads with AC power that is distinct and different from the grid AC power without unnecessary use of multiple grid disconnect/connect switches, automated or manual transfer panels, and multiple variable frequency motor drives. Advantageously this eliminates costs and control firmware sophistication that would otherwise be required to install, separately program and power a facility to prevent back feeding an active or disabled grid with solar power, battery power, or EV battery discharged power that operates differently from the local grid AC frequency.

In some embodiments, addition of a utility grid meter plug-in adapter, referred to herein as a Micro grid in a Meter, that is electrically configured to contain electronic switches, sensors, logic, CPU, memory, backup battery, public safety interlock, and communication circuits. When such devices and firmware/software are installed in the adapter, a new mode of operation for grid tied solar and batteries can be safely and automatically or remotely commanded to engage and operate. This new mode of operation can be referred to as Public Safety Failsafe Grid Independent and Islanding Micro grid Operation of a Grid Tied solar and/or battery system.

In some embodiments, the adapter is physically connected to and located physically and electrically between the facility grid connected utility meter, a grid tied solar system with solar DC to AC inverters, battery DC to AC inverters, and a local electrical breaker panel that connects the local facility electrical energy loads to the utility meter through the new Adapter.

In some embodiments, when the grid is shut down or disabled, Energy Quarterback circuits contained within the Meter Adapter automatically detect and switch a utility main power switch (2PST for single-phase or 3PST for 3-Phase) into a new grid independent or islanding micro grid mode of operation.

In some embodiments, a mechanically linked public safety interlock contained within the adapter and mechanically linked to the 2PST or 3PST Grid ON/OFF switch confirms that the grid and local facility are safely disconnected from one another.

In some embodiments, Energy Quarterback uses the safety interlock switch logic to ascertain and communicate to the solar and battery inverter to begin converting available DC solar and battery energy into AC power that powers facility electric energy loads.

In some embodiments, when safely disconnected from the grid and confirmed by public safety interlock switch, activation of dynamic variable frequency power electronics converts available DC from solar and/or batteries to AC power that is dynamically adjusted to deliver AC power frequencies from approximately 1 Hz to approximately 100 Hz to anticipate, optimize, and balance facility electric energy loads to match available or anticipated battery or solar power. Use of AI feedback and feedforward loops plus successive approximation logic to recall prior similar operating conditions.

In some embodiments, input of remote distal on-demand commands including ADR 2.0B and other command and control communication protocols received through Energy Quarterback to set operations of facility circuits, switches, AC to DC inverters, EV chargers, and a dynamic frequency power module to enable local solar and storage assets to meet requirements for the grid and local facility electric energy load needs.

In some embodiments, charge EVs from sustainable local solar and batteries. When appropriate, discharge excess EV battery storage to meet local facility or grid needs on demand, as commanded by Energy Quarterback communication, command, and control logic.

Some embodiments can comprise use of an AI feedback and feedforward loop connected to an MCU or FPGA called the Energy Quarterback that senses and directs the flow of AC and DC energy through DC to AC inverters, DC switches, AC switches, PWM power electronics and to electrically isolate or connect the facility and its electrical energy loads to grid circuits, retain connection to solar energy and stored battery energy.

In some embodiments, to dynamically shift the frequency of AC power that is delivered by dynamic frequency power electronics or inverters to the facility electrical energy loads in response to AI feedback and feedforward factors to match available solar power and battery storage capacity and anticipated status.

In some embodiments, to power a facility and its connected loads using dynamic frequency agile power electronics in a manner that operates at or deviates from local grid frequencies of operation (from approximately 1 Hz to approximately 100 Hz) for optimum energy use efficiency, dynamic local facility load management, grid balancing services, plus reduction of facility greenhouse gas (GHG) footprint from acquired fossil fuel power.

In a local grid connected facility with or without solar and storage, use of new AI controlled power electronics that automatically or on command; 1) electrically connect or isolate a facility and its specific loads, generation, and storage from the grid 2) dynamically shifting the frequency of AC power delivered to a facility or its loads from grid, solar, or batteries through a single DC bus-connected dynamic frequency agile variable frequency electronics in response to a multiplicity of AI (feedback and feedforward) factors that automatically optimize facility energy use efficiency, facility load management, effectiveness of solar and battery electrons, grid balancing, lowest GHG footprint, grid independence, EV Charging, and other electric energy related functions.

Eliminates need for facility AC switching to achieve lowest GHG footprint and options to connect, island, or isolate a facility, its solar, batteries, and its loads from the grid. Further eliminates a multiplicity of DC to AC inverters that connect but do not manage, allocate, or alter AC frequency of power distribution throughout a facility for greatest electrical energy effectiveness and efficiency in powering its AC loads.

Use of innovative variable frequency electronics functions combined with high efficiency AC to DC conversions, combined with a centralized facility or subgroup DC power bus with automated, local, or remotely activated DC power steering and switching of devices and systems that can isolate a facility or its specific DC generating and AC load circuits and systems (grid power, EV, solar, battery storage, HVAC, refrigeration, appliances, computers, servers, and consumer electronics) to create a device or system specific grid islanding properties without the need for grid islanding or transfer switches.

Thereby creating a new class of grid isolating variable frequency electronics for greater energy efficiency, reduced GHG footprint and specific direction and allocation of power within a facility to specific loads from any combination of the grid or solar or storage batteries with or without dynamic frequency shifting power electronics. Use of a facility DC mixing and electron steering/switching bus.

The net overall efficiency gains of variable frequency AC power far outweigh AC to DC grid power conversion losses and DC to AC inverter losses.

Grid AC electrical energy, converted to DC power locally on site to power facility electrical loads through a dynamic agile frequency power electronics module using PWM or other high efficiency methods. Steering diodes, PWM, and SCR switching are internal to the device through connection to an internal DC bus bar. Control signals to manage energy flows in a local facility will come from the AI Energy Quarterback module DC solar panels connect directly to the internal DC bus bar without need for DC to AC inverter to supplement or replace grid energy that may power a connected facility's electric loads at AC Frequencies that dynamically range between approximately 1 Hz to approximately 100 Hz.

Grid energy, converted to DC Power or Solar DC power will charge DC batteries connected to an internal DC bus bar through PWM charging and energy management circuits.

When the grid is shut down or incapacitated, the connected DC solar or batteries will automatically power the connected facility electrical energy loads through a DC to AC dynamically variable frequency power electronics module.

When the grid requires solar overgeneration mitigation, Energy Quarterback command and control logic will direct such excess electrons to be stored in on-site batteries.

When grid requires renewable energy electrons from approximately 3:30 pm-7:30 pm locally, Energy Quarterback command and control logic will direct the flow of stored electrons through a DC to AC PWM conversion operating at grid frequency and voltage (approximately 60 Hz for N. America or approximately 50 Hz for Europe) that is switched onto the grid by MIM Adapter. Action enables participation in transactive energy to sell locally stored solar electrons to the grid at premium wholesale pricing.

In some embodiments, the adapter can comprise at least one of the followings: a digital or analog grid voltage and status signal; digital logic circuits (FPGA, microcontroller, SOC with GPIOs and communications); an electrically operated and mechanically latching grid power on/off switch; a backup battery to power contained digital logic and to power the mains power; a switch when the grid is off; a mechanically linked interlock switch, linked to the grid mains latching power on/off switch and configured as a public safety interlock to confirm the grid mains latching power on/off position is open to prevent accidental back feeding of a disabled grid circuit from a local facility energized grid-tied solar system; an H-configured motor control circuit for activating the adapter contained motor driven or latching grid power on/off switch; DC to DC boost converter to raise backup battery voltage and amperage sufficiently to actuate the grid power on/off switch; and a communications system (wired or wireless) that serially communicates with a local Solar system DC to AC inverter.

In some embodiments, the connect/disconnect switch can comprise mechanically linked safety interlocks, configured adapter plugs into meter socket as physical middleware module, utility meter plugs into adapter module. The connect/disconnect switch, automatically configures any grid tied solar system to become an automatic or remotely actuated grid independent solar micro grid in islanding mode. The power controller supersedes the need for grid tied solar inverters or microinverters to automatically shutdown to prevent "back feeding" solar onto a de-energized grid and enables wildfire mitigation while local facility is independently powered by solar panel. The power controller can operate local solar independently of a grid to prevent solar overgeneration on the grid. The power controller enables local facility solar or storage batteries to deliver dynamically variable frequency power operate and generate frequencies between approximately 1 Hz and approximately 100 Hz and other than the local grid frequency to power connected loads and deliver optimum dynamic energy efficiency from loads and optimum energy effectiveness from varying and fixed renewable energy resources and stored energy. The power controller enables local facility to separate all loads from the grid and power them independently during demand response periods.

In some embodiments, the micro grid system can prevent local power from accidently being exported or "back feeding" solar or stored energy to the grid from a grid tied solar or energy storage system. This, combined with CPU, memory, sensing and actuating circuits and communication devices, can functionally transform a grid tied solar system into a grid independent islanding micro grid by automated or remote command.

In some embodiments, the micro grid system can confirm position of the grid connect/disconnect switch, send a logic signal to Energy Quarterback, communicate that it is safe to operate a solar or battery DC to AC inverter, comprise of high-power DC steering diodes in a grid AC to DC power supply, communicate with an Energy Quarterback communication, command, and control logic module and DC to AC inverter that it is safe to operate and dynamically generate AC Power at non grid AC frequencies of between approximately 1 Hz and approximately 100 Hz to more efficiently deliver power to connected loads but not back feed off-grid out of sync energy to a 50 Hz or 60 Hz connected grid, include any electrical load not limited to fans, motors, lights, HVAC, computers, refrigerators, electric stoves, electric hot water heaters, electric heat pumps, computer servers, communication systems, medical devices, electric manufacturing devices and systems, EV Chargers, and electrical devices and appliances of all types and varieties commonly or uncommonly associated within or outside of an electrically energized facility.

Above devices contained within the new adapter are configured to automatically sense and disconnect and then activate a grid tied locally energized solar system to feed local facility loads without back feeding solar electrons onto a disabled grid. These sensors, switches, digital logic, H motor control, DC to DC boost circuits, and wired or wireless serial communications are uniquely designed, configured, and placed within the physical confines of a new utility meter adapter for the purpose of safely establishing a grid independent local solar micro grid without requiring a separate manual or automatic electrical transfer panel during such times as the connected grid is disabled and not conveying power to the local facility and its myriad AC loads.

During a grid outage, the addition of a new grid tied, grid disconnect relay switch module with public safety failsafe interlocks prevents power from being accidently exported or "back feeding" the local grid from a grid tied solar or battery system. This innovation, combined with 6 additional circuits and devices, functionally transform a grid tied solar or battery system into a grid independent islanding micro grid on incidence of automated or remote command.

A grid monitoring sensor located internally or externally to the adapter reports to the adapter logic circuitry when grid energy has ceased powering the local grid tied facility. A backup battery within the adapter then begins powering the adapter digital logic circuits, sensors, switches, interlocks, and communication circuits to affect an adapter main power switch to automatically disconnect from the grid in a manner that ensures public safety requirements that prevent and confirm that a local grid tied solar system and its associated grid tied DC to AC power inverter will power the local facility loads but not back feed its electrons onto a disabled grid.

After a measured time period of grid power being disabled, the grid status logic sends a command signal through the adapter H motor direction control logic to activate the adapters DC to DC boost circuit (3.7 vdc battery to 12 vdc) to power and actuate the adapter grid main power switch solenoid sufficiently to switch and disconnect or reconnect the grid connection to the local facility, its loads, and its grid tied solar system with DC to AC inverter away from the local facility grid connection.

At the time and incidence of the adapter-located grid mains power switch opening its contacts and separating local facility loads and local solar system and DC to AC inverter away from the local facility grid connection, a mechanically linked switch configured as a public safety interlock sensor confirms that the grid mains on/off switch has opened its contacts to the grid. Upon incidence of the public safety interlock switch confirming a grid disconnect from the facility, the adapter's logic circuits communicate with and signal a local facility solar DC to AC inverter to begin converting solar electrons into AC power that is useful for powering the connected facility loads without back feeding the disabled grid.

Use of a new utility meter adapter and its contained sensors, switches, logic, public safety interlock, separate and independent operation of grid tied solar system and its inverter when the grid is producing power A communication and logic system override that causes the above meter adapter contained electronics to activate the local grid tied solar for independent grid islanded operations irrespective of the grid power or condition. for many reasons, this mode of operations is desirable. these reasons include but are not limited to grid balancing, demand management, mitigating solar overgeneration on the grid and other electrical system, grid management, economic, and GHG mitigations strategies Local wired or wireless serial communication networking with a nearby SOC device, called AI Energy Quarterback, that consists of wireless radio(s), CPU, memory, voltage regulators, and a serial UART that receives status signals from the adapter based electronics and in turn controls operations of a connected solar and/or battery based DC to AC inverter that is enhanced to include novel circuitry that dynamically controls the inverters AC frequency of operation, including grid tied solar system with energy storage. While dynamic variable frequency operation has been proven to improve the efficiency of an AC electric motor by as much as 82%, it has never been applied to a solar DC to AC inverter where its frequency of operation is set at factory or upon installation solely to match and always synchronize with the local connected power grid frequency of operation at 50 Hz or 60 Hz depending on the physical location of the Grid. Electrical and thermal feedback in the EQB is used to ensure that inverter frequency of operation remains within safe operating limits for each connected energy load and device.

While utility meter adapters are not new, they are not used with electronics, logic, and switches to automatically or on-demand transform a grid tied solar system into an islanding micro grid or grid independent solar system that further employs dynamic and variable frequency of power operations from an inverter to optimize the effectiveness of every solar, stored, watt, kilowatt, or megawatt.

It is the AC to DC conversion of the grid power for the entire facility with the subsequent employment of variable frequency of power from a contained DC to PWM AC inverter with open inputs for DC solar and battery that enable a facility's connected AC motors (HVAC, heat pumps, refrigerator, washer, dryer, pool pump, fans, etc. to operate with optimal efficiency. A CEC study on heat pumps determined that these devices delivered 42% to 82% energy efficiency by employing lower frequencies of supplied power. Our innovation is employing this to an entire facility with feedback and external cloud inputs to drive optimal efficiency for an entire facility while economizing on the number of inverters used for facility optimization, solar DC to AC inverters, and battery DC to AC inverters.

Energy Quarterback may signal inverter to use a very low frequency startup mode such as 1 Hz, 2 Hz, 3 Hz or some other frequency that allows the associated inverter to also "soft start" connected electrical appliances and devices. In other circumstances, buck/boost circuits are used to instantly and briefly supply increased inrush current to start motors.

Use of a AI Energy Quarterback Networked device to communicate with sensing, control, switching, public safety interlock, and other circuits contained within a new utility meter adapter to control a solar or solar plus energy storage battery or a separate energy storage battery inverter in a grid tied solar system whereby such inverter accepts commands on a dynamic basis to operate as an islanding micro grid inverter with dynamically varying frequency of operation when a public safety or emergency grid outage occurs. Also encompasses operation of the inverter in a dynamically variable frequency of operation manner at any time when the adapter electronic circuits or other grid separating circuits and switches are used to operate a local grid tied solar and solar with battery inverter independently from the local power grid.

The following describes a method of adjusting and controlling the AC frequency of operation of a solar inverter of an entire facility to optimally and efficiently match a mix of electrical energy load needs and grid needs that are connected to such frequency dependent power electronics in a grid connected or solar and battery connected inverter that are connected to an electrical load distribution panel.

The insertion of high power load dependent power electronics that has both frequency agility and voltage agility operations, through use of high power PWM circuits comprising of IGBTs or MOSFETs, are managed by an Energy Quarterback device consisting of energy load sensors, A to D converters, CPU, memory, and firmware that constantly monitors the collective and/or individual loads attached to a facility electrical breaker panel plus cloud data base information about the grid and utility needs and financial programs available for modifying a facility loads.

Adapter based grid connect/disconnect switch, with mechanically linked public safety interlock sensor, is in series with and "behind" the utility meter through the adapter as a 2PST power switch for single phase grid tied solar systems. Switch is configured as 3PST with mechanically linked public safety interlock sensor. Where a mechanical switch is not useful, size constrained, or desired, high powered MOSFETS, IGBTs, SCRs, or steering diodes can be used in the alternative with current and or voltage sensing circuits arranged to confirm either Grid connected or independent/disconnected status Energy Quarterback To provide grid balancing services, the micro grid and its Energy Quarterback must be electrically connected to a grid in a grid connected mode to enable electrical and control level interconnection to distal solar and distal wind generating power plants and to their available renewable electrons. This innovative design enables the use of a local micro grid Energy Quarterback to constantly balance the various and diverse energy needs of multiple interconnected micro grid energy tenants with local micro grid energy sources, energy storage, and distal energy resources in an innovative innovation mode called dynamic energy efficiency. On an instant basis, in either form of grid isolated condition, the Energy Quarterback assesses the local PV solar output, identifies battery capacity for store and forward of energy, assesses local weather, time of day, and occupancy, and commands connected smart thermostats, VVR on HVAC and refrigeration motors, smart lighting, smart plug loads, water heaters, and smart inverter controls on PV and batteries, plus use of Cogen power plant power and heat.

When operating in the grid connected mode of operation, the Energy Quarterback also assesses distal (remote) energy supplies and energy storage to automatically acquire such grid energy excesses for allocation into the local facility.

During periods when the grid is "down" for any of its myriad reasons, a micro grid must switch operations to operate independently from the grid and in this grid isolating mode, its primary function shifts to independently balance energy supplies into localized and tenant energy loads or energy storage on the micro grid. Thus, both methods of grid connected and grid isolated operation modes are considered controlled by the Energy Quarterback described herein.

Algorithms operating on Energy Quarterback provide on-site energy load management through dynamic energy efficiency including dynamic frequency of power delivery from inverters during grid connected and grid independent operations for grid balancing and providing on-site tenants with renewable energy and new renewable energy grid balancing methods, techniques, including the dynamic delivery of varying frequency power from an inverter.

Cybersecurity

Use of secure local communication connections to securely assess, manage, control, and report on, acquisition of distal renewable energy, local renewable energy production, and local or distal storage from a mix of on-site renewable power plants, energy storage, plus integration of distal grid connected renewable distributed energy resources to supply divergent tenant energy needs plus provide renewable energy grid balancing services.

Hardware Cybersecurity plus use of Internet Isolation modes as defined within the Energy Quarterback:

Multi-Tenant Micro grid Energy Storage:

Mixing storage types to meet multi-tenant electrical load needs.

Mixing different Energy and battery storage technologies for different purposes in a multi-tenant micro grid. Energy storage types and chemistries will include hydrogen production plus storage plus fuel cells, Graphene batteries, various lithium Ion battery chemistries. Flow batteries with various chemistries including salt or vanadium, Zinc Air batteries, and other types of battery chemistries to more closely match multiple tenant load profiles in multi-tenant mixed use commercial properties.

Dynamic Energy Efficiency, through a Dynamic Frequency inverter:

Use of Variable Frequency Current Limiting mode of operation of a whole facility electrical panel-connected inverter to vary the consumption, speed, and energy efficiency of connected Motors, fans, compressors, washing machines, dryers, water pumps, pool pumps, HVAC systems, Heat pumps, and other motorized devices and appliances.

Accepting Utility or 3rd party remote signaling of Grid for Demand Response, Demand Management, or Solar Overgeneration Mitigation:

The Electrical Power Generation Disconnect Switch can be activated by the Energy Quarterback for:

Grid power outage, Local Operation, or Remote signaling to remove the Grid tied solar, batteries, Generators, and Facility loads from the grid to power the facility but not contribute to solar overgeneration on the Grid. An NEC and California SB338 compliant solution.

Includes a physically attached interlocking sensor that is only activated when Grid Disconnect Switch is in the Grid Independent Micro grid Islanding Operating Mode.

Active Frequency Shift to limit PV inverter current by lowering the AC line frequency that is fed to and synchronized with Inverters or connected loads thereby causing higher efficiency or limited Ampacity power output in Grid Independent Micro grid Islanding mode of operation.

Solar Inverter to supply facility loads with dynamic frequency of operations between 1 Hz to 100 Hz to ensure Dynamic Energy Efficiency of all connected motors, HVAC, fans, Heat pumps, washers, dryers, etc., and energy effectiveness of all supplied secondary power or storage resources.

Use of Voltage Buck or Boost circuits on individual loads as needed to provide inrush currents to start connected motors.

The innovations, devices, and circuit arrangements that enable Variable Frequency inverter dynamic energy efficiency operations are described in this filing through the combination of:

Interlocking automated failsafe Grid switching relay that separates the facility and its Grid tied solar from the Grid.

Energy Quarterback energy management, communication, command, and control logic.

Firmware changes to Grid tied inverters to enable Dynamic Agile Frequency of AC power output from DC Solar or battery power.

Mechanically linked Public Safety switch sends a signal to Energy Quarterback microprocessor indicating that the Grid is currently disconnected from the facility and solar system, thereby permitting the solar system inverter to turn on and begin converting solar DC electrons into AC electrons at Dynamic Energy Efficiency selected frequency of operation (1 Hz-100 Hz) for use of locally generated solar and stored energy by the facility loads.

A switched electric signal generator for these purposes consists of analog or digital AC signal generating circuits located within the Energy Quarterback or within firmware located within a Grid Tied or an Off Grid inverter. This signal generator device is current limited to supply low power enabling signals at TTL logic levels, or other predetermined format and protocol levels, including a 240 VAC center tapped or 120 VAC at 1 Hz-60 Hz transformer operating at low power levels as non-limiting examples. The purpose of this switched electric signal generator is to function as at 1 Hz to 100 Hz or other preselected frequency and voltage to signal a Grid Tied inverter to begin converting solar DC output to AC power to power the facility-connected loads, devices, and appliances. It can also be configured to signal an inverter that has Grid Independent Islanding Micro grid operating firmware. Constant voltage and current limiting devices are used in Signal Generator to limit the current or power delivered by this signal generator to the inverter but may or may not limit the voltage or frequency supplied to the connected energy loads, devices, and appliances.

The switched electric signal generator is activated and begins supplying an enabling signal of approximately 1 Hz to approximately 100 Hz causing a grid tied inverter, string inverter optimizer, or microinverter to be switched on to provide Renewable Distributed Energy power exclusively to facility loads and any connected energy storage device or batteries through the electrical distribution panel but not to the grid.

On Demand Islanding

Remote activation of an internal 2PST or 3PST Relay or Solenoid device configured as a Grid Connect/Disconnect switch and combined with additional components to result in a new utility commanded and switched mode of operation of a grid tied solar inverter for purposes of converting a grid tied solar and battery inverter and related systems and devices into a grid independent micro grid islanding solar system.

Use of high powered AC or DC steering Diodes, SCRs, Thyristors, MOSFETs, IGBTs, or other AC or DC gating devices and associated public safety interlocking and logic plus firmware in a meter adapter to prevent back-feeding power from locally generated solar and stored energy and energy from a grid powered DC to AC dynamic frequency inverter onto a local grid.

Terminology

AC power supplied or outputted from the grid or the power controller can be replaced with AC voltage, AC current, AC energy. DC power supplied from the grid or the power controller can be replaced with DC voltage, DC current, DC energy.

The embodiments disclosed herein are presented by way of examples only and not to limit the scope of the invention. One of ordinary skill in the art will appreciate from the disclosure herein that many variations and modifications can be realized without departing from the scope of the present disclosure.

The term "and/or" herein has its broadest least limiting meaning which is the disclosure includes A alone, B alone, both A and B together, or A or B alternatively, but does not require both A and B or require one of A or one of B. As used herein, the phrase "at least one of "A, B, "and" C should be construed to mean a logical A or B or C, using a non-exclusive logical or.

The description herein is merely illustrative in nature and is in no way intended to limit the disclosure, its application, or uses. For purposes of clarity, the same reference numbers will be used in the drawings to identify similar elements. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip (SOC). The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage. Although the foregoing invention has been described in terms of certain preferred embodiments, other embodiments will be apparent to those of ordinary skill in the art from the disclosure herein. Additionally, other combinations, omissions, substitutions and modifications will be apparent to the skilled artisan in view of the disclosure herein. Accordingly, the present invention is not intended to be limited by the reaction of the preferred embodiments, but is to be defined by reference to claims.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A microgrid comprising:
    an AC to DC converter configured to be in communication with a utility meter, the utility meter having an input that receives electrical power from an electrical grid, the output of the utility meter configured to supply a grid-tied AC signal, the AC to DC converter configured to convert the grid-tied AC signal to a first DC signal, the AC to DC converter including steering circuitry that is configured to prevent backfeeding AC or DC energy into the electrical grid;
    a bus bar in communication with the AC to DC converter, the bus bar configured to receive the first DC signal and provide a second DC signal;
    a frequency variable and/or voltage variable inverter in communication with the bus bar and electrical loads of a facility, the frequency variable and/or voltage variable inverter configured to receive the second DC signal, to convert, responsive to one or more control signals, the second DC signal into a first AC signal having variable frequency and/or variable voltage, and to provide the first AC signal having the variable frequency and/or voltage to the electrical loads of the facility;
    a DC to AC inverter in communication with the bus bar, the DC to AC converter configured to receive, responsive to the one or more control signals, the second DC signal from the bus bar, and convert the second DC signal to a second AC signal; and
    a switch having a first state and a second state, the switch in communication with the utility meter and the DC to AC inverter, the switch in the first state configured to interrupt communication between the DC to AC inverter and the utility meter, the switch in the second state configured to provide communication between the utility meter and the DC to AC inverter, wherein the switch in the second state permits the second AC signal to be received by the electrical grid via the utility meter.

2. The microgrid of claim 1, wherein the switch includes a relay.

3. The microgrid of claim 1, wherein the switch includes a solid state switch device selected from the group consisting of a thyristor, insulated-gate field-effect transistor (IGFET), metal-oxide-semiconductor field-effect transistor (MOSFET), silicon controlled rectifier (SCR), and insulated-gate bipolar transistor (IGBT).

4. The microgrid of claim 1 further comprising secondary energy sources in communication with the bus bar.

5. The microgrid of claim 4, wherein the bus bar is further configured to receive DC energy from the secondary energy sources and combine the DC energy from the secondary energy sources and the first DC signal to provide the second DC signal.

6. The microgrid of claim 4, wherein the secondary energy sources include one or more of a solar panel, a battery, or an electric vehicle.

7. The microgrid of claim 1, wherein the second AC signal is synchronized with the frequency of power of the electrical grid.

8. The microgrid of claim 1 further comprising one or more sensors between the AC to DC converter and the utility meter to sense characteristics of the grid-tied AC signal, wherein the one or more control signals are based at least in part on the sensed characteristics of the grid-tied AC signal.

9. The microgrid of claim 1 further comprising one or more sensors between the frequency variable and/or voltage variable inverter and the electrical loads of the facility to sense characteristics of first AC signal having the variable frequency and/or variable voltage, wherein the one or more control signals are based at least in part on the sensed characteristics of the first AC signal having the variable frequency and/or variable voltage.

10. A microgrid system comprising:
    an adapter in communication with an electrical grid, the adapter configured to receive a grid-tied AC signal from the electrical grid;
    power control circuitry comprising:
        an AC to DC converter configured to receive the grid-tied AC signal from the adapter and convert the grid-tied AC signal to a first DC signal, the AC to DC converter including steering circuitry that is configured to prevent backfeeding AC or DC energy into the electrical grid;
        a bus bar in communication with the AC to DC converter, the bus bar configured to receive the first DC signal and provide a second DC signal;
        a frequency variable and/or voltage variable inverter in communication with the bus bar and electrical loads of a facility, the frequency variable and/or voltage variable inverter configured to receive the second DC signal, to convert, responsive to one or more control signals, the second DC signal into a first AC signal having variable frequency and/or variable voltage, and to provide the first AC signal having the variable frequency and/or voltage to the electrical loads of the facility; and
        a DC to AC inverter in communication with the bus bar, the DC to AC converter configured to receive, responsive to the one or more control signals, the second DC signal from the bus bar, and convert the second DC signal to a second AC signal; and
    a switch having a first state and a second state, the switch in communication with the utility meter and the DC to AC inverter, the switch in the first state configured to interrupt communication between the DC to AC inverter and the utility meter, the switch in the second state configured to provide communication between the utility meter and the DC to AC inverter, wherein the switch in the second state permits the second AC signal to be received by the electrical grid via the utility meter.

11. The microgrid system of claim 10 further comprising a processor and memory having instructions that when executed cause the processor to control the state of the switch based at least in part on sensed power characteristics of the grid-tied AC signal.

12. The microgrid system of claim 10, wherein the second AC signal is synchronized with the frequency of power of the electrical grid.

13. The microgrid system of claim 10, wherein a microgrid includes the power control circuitry and the switch.

14. The microgrid system of claim 10, wherein the adapter includes the switch.

15. A method to control a microgrid, the method comprising:
switching a switch between a first state and a second state, the switch in communication with an electrical grid and an DC to AC inverter, the switch in the first state configured to interrupt communication between the DC to AC inverter and the electrical grid, the switch in the second state configured to provide communication between the electrical grid and the DC to AC inverter;
with the switch in the first state,
receiving a grid-tied AC signal from an electrical grid via a utility meter;
converting, with an AC to DC converter, the grid-tied AC signal to a first DC signal, the AC to DC converter including steering circuitry that is configured to prevent backfeeding AC or DC energy into the electrical grid;
receiving, with a bus bar, the first DC signal and providing, with the bus bar, a combined DC signal;
converting, with the DC to AC inverter and responsive to one or more control signals, the combined DC signal into a first AC signal having variable frequency and/or variable voltage; and
providing the first AC signal having the variable frequency and/or voltage to electrical loads of a facility.

16. The method of claim 15, further comprising:
with the switch in the second state,
receiving, with the bus bar, DC energy from secondary energy sources;
combining, with the bus bar, the DC energy from the secondary energy sources to provide the combined DC signal; and
converting, with the DC to AC inverter and responsive to the one or more control signals, the combined DC signal from the bus bar to a second AC signal, wherein the switch in the second state permits the second AC signal to be received by the electrical grid.

17. The method of claim 16 further comprising synchronizing the second AC signal with frequency of power of the electrical grid.

18. The method of claim 15, wherein the switch is switched responsive to the one or more control signals.

19. The method of claim 18, wherein the one or more control signals are responsive to sensed characteristics of the grid-tied AC signal.

20. The method of claim 18, wherein the one or more control signals are responsive to sensed characteristics of the first AC signal having the variable frequency and/or voltage.

\* \* \* \* \*